(12) United States Patent
Takizawa et al.

(10) Patent No.: US 10,910,068 B2
(45) Date of Patent: Feb. 2, 2021

(54) MEMORY SYSTEM AND NONVOLATILE MEMORY

(71) Applicant: KIOXIA Corporation, Tokyo (JP)

(72) Inventors: Kazutaka Takizawa, Kanagawa (JP); Yoshihisa Kojima, Kanagawa (JP); Masaaki Niijima, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/727,488

(22) Filed: Dec. 26, 2019

(65) Prior Publication Data

US 2020/0303018 A1 Sep. 24, 2020

(30) Foreign Application Priority Data

Mar. 18, 2019 (JP) ................................. 2019-050496

(51) Int. Cl.
| | |
|---|---|
| *G11C 16/26* | (2006.01) |
| *G11C 16/04* | (2006.01) |
| *G11C 16/22* | (2006.01) |
| *H01L 27/11582* | (2017.01) |
| *G11C 11/56* | (2006.01) |
| *H01L 27/11556* | (2017.01) |

(52) U.S. Cl.
CPC .......... *G11C 16/26* (2013.01); *G11C 11/5642* (2013.01); *G11C 11/5671* (2013.01); *G11C 16/0483* (2013.01); *G11C 16/22* (2013.01); *H01L 27/11556* (2013.01); *H01L 27/11582* (2013.01)

(58) Field of Classification Search
CPC . G11C 16/26; G11C 11/5642; G11C 11/5671; G11C 16/0483; G11C 16/22; H01L 27/11556; H01L 27/11582
See application file for complete search history.

(56) References Cited

U.S. PATENT DOCUMENTS

| | | | |
|---|---|---|---|
| 9,431,123 B2 | 8/2016 | Kim | |
| 9,721,652 B2 | 8/2017 | Puthenthermadam et al. | |
| 9,875,803 B2 | 1/2018 | Asami et al. | |
| 9,952,944 B1 * | 4/2018 | Alrod ................. | G11C 16/3459 |
| 2018/0261275 A1 | 9/2018 | Takizawa et al. | |
| 2019/0057749 A1 * | 2/2019 | Chen ...................... | G11C 16/26 |
| 2019/0371416 A1 * | 12/2019 | Kuddannavar .... | G11C 16/0483 |

* cited by examiner

*Primary Examiner* — Jay W. Radke
(74) *Attorney, Agent, or Firm* — Kim & Stewart LLP

(57) ABSTRACT

A memory system includes a nonvolatile memory and a controller. The nonvolatile memory includes memory cells at intersection locations of stacked word lines and a memory pillar passing through the word lines in a stacking direction, the word lines including a first group of word lines stacked above a second group of word lines. The controller reads data of a first memory cell in a first read mode and reads data of a second memory cell in a second read mode. The first memory cell is, and the second memory cell is not, at an intersection location of a word line that is in a boundary area of the first and second groups of word lines and the memory pillar. The boundary area is adjacent to a location of the memory pillar where a width of the memory pillar discontinuously changes along the stacking direction.

19 Claims, 17 Drawing Sheets

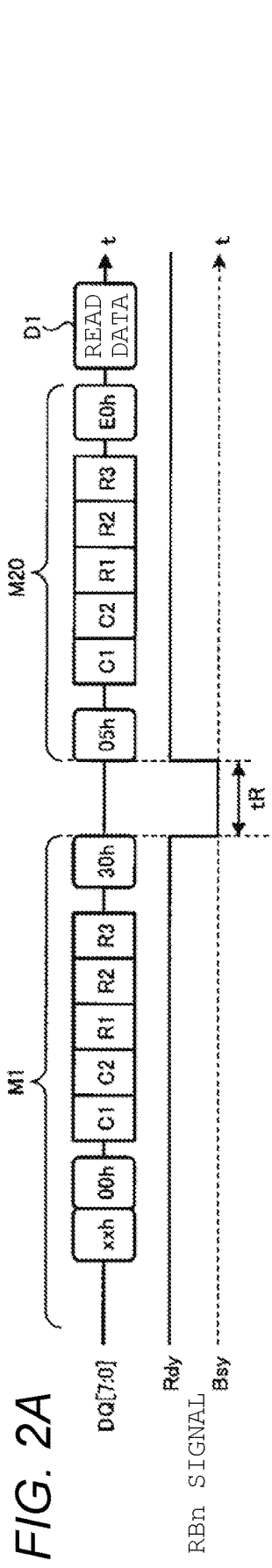
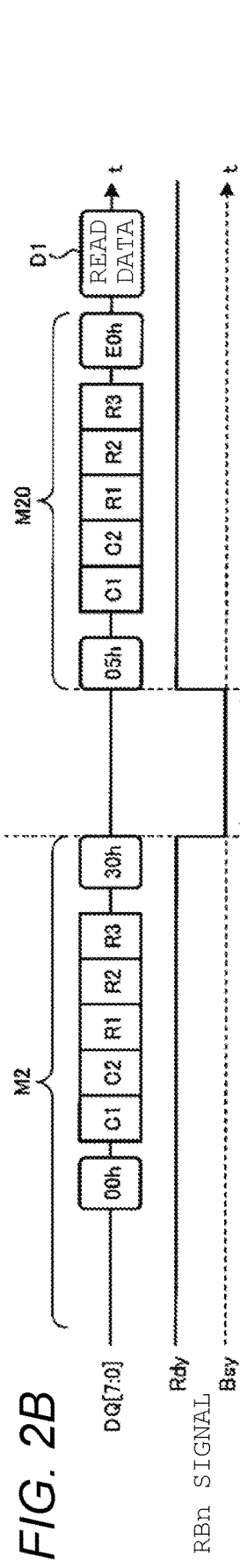
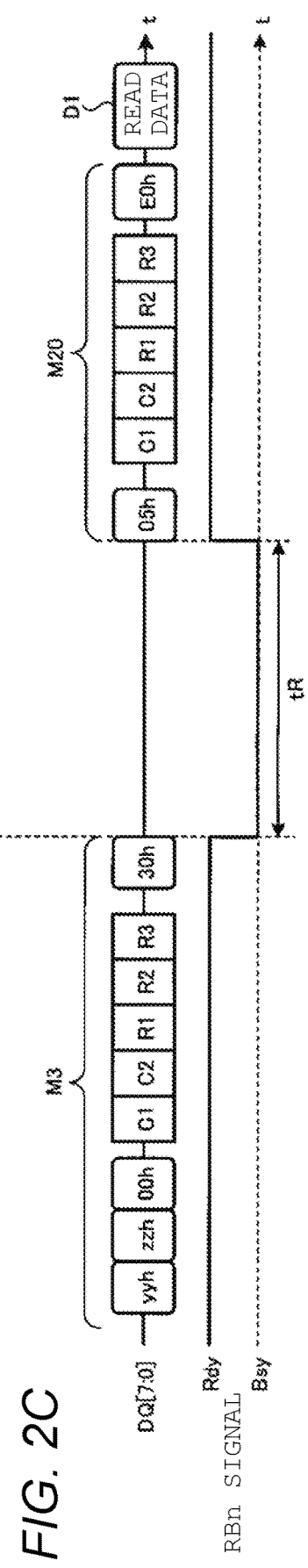

FIG. 8

| WORD LINE IDENTIFICATION INFORMATION (23b11) | PAGE IDENTIFICATION INFORMATION (23b12) | APPLICATION DESIGNATION (23b13) |
|---|---|---|
| WL95 | UPPER | OFF |
| WL95 | MIDDLE | OFF |
| WL95 | LOWER | OFF |
| ⋮ | ⋮ | ⋮ |
| WL49 | UPPER | OFF |
| WL49 | MIDDLE | OFF |
| WL49 | LOWER | OFF |
| WL48 | UPPER | ON |
| WL48 | MIDDLE | ON |
| WL48 | LOWER | ON |
| WL47 | UPPER | OFF |
| WL47 | MIDDLE | OFF |
| WL47 | LOWER | OFF |
| ⋮ | ⋮ | ⋮ |
| WL0 | UPPER | OFF |
| WL0 | MIDDLE | OFF |
| WL0 | LOWER | OFF |

23b1

MEMORY SYSTEM AND NONVOLATILE MEMORY

CROSS-REFERENCE TO RELATED APPLICATION(S)

This application is based upon and claims the benefit of priority from Japanese Patent Application No. 2019-050496, filed Mar. 18, 2019, the entire contents of which are incorporated herein by reference.

FIELD

Embodiments described herein relate generally to a memory system and a nonvolatile memory.

BACKGROUND

In a memory system including a nonvolatile memory, a plurality of memory cells is arranged in a three-dimensional manner and is configured as a memory cell array in the nonvolatile memory. For example, the plurality of memory cells may be arranged in the three-dimensional manner at intersections of a plurality of word lines stacked to form word line groups and memory pillars passing through the word line groups in a stacking direction. In such a case, it is desirable to improve the reliability of a read operation for reading data from the plurality of memory cells.

DESCRIPTION OF THE DRAWINGS

FIGS. 2A to 2C are diagrams illustrating a period tR during which a ready/busy signal RBn indicates a busy state Bsy in each read mode;

FIG. 8 is a diagram illustrating one example of the control information used in the embodiment;

DETAILED DESCRIPTION

Figure 1:
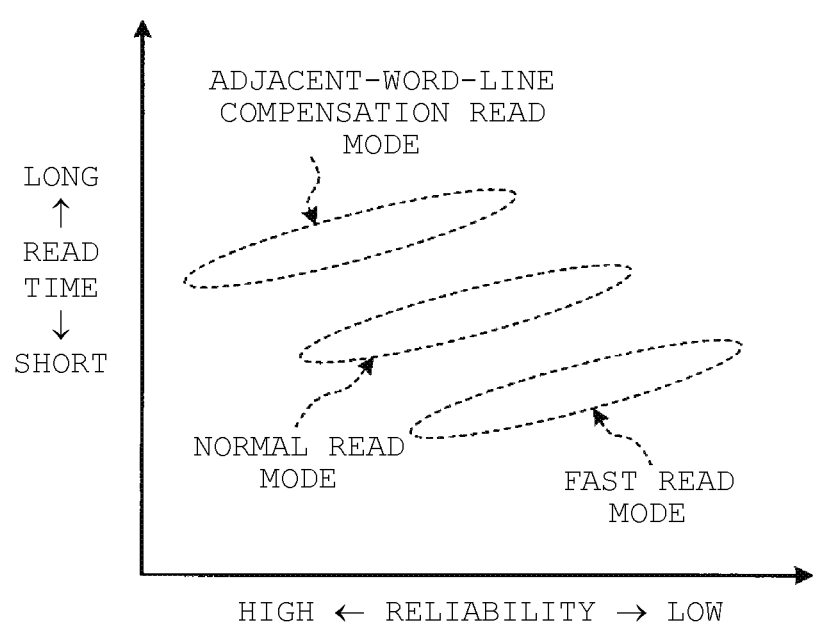
FIG. 1 is a diagram conceptually illustrating a relationship between a read time of each read mode and reliability.

Embodiments provide a memory system and a nonvolatile memory, by which it is possible to improve the reliability of a read operation.

In general, according to one embodiment, a memory system comprises a nonvolatile memory and a controller. The nonvolatile memory includes a plurality of memory cells at intersection locations of a plurality of stacked word lines and a memory pillar passing through the plurality of word lines in a stacking direction, the plurality of word lines including a first group of word lines stacked above a second group of word lines in the stacking direction. The controller is configured to read data of a first memory cell in a first read mode and to read data of a second memory cell in a second read mode different from the first read mode, wherein the first memory cell is at an intersection location of a word line that is in a boundary area of the first and second groups of word lines and the memory pillar, and the second memory cell is at an intersection location of a word line that is not located in the boundary area. The boundary area that includes the word line is adjacent to a location of the memory pillar where a width of the memory pillar in a direction perpendicular to the stacking direction of the memory pillar discontinuously changes along the stacking direction.

Hereinafter, a memory system according to an embodiment will be described in detail with reference to the accompanying drawings. The embodiment does not limit the present disclosure.

Embodiment

A memory system according to an embodiment has a nonvolatile memory such as a NAND type flash memory. In the memory system that includes the nonvolatile memory, a plurality of memory cells is arranged in a three-dimensional manner and is configured as a memory cell array in the nonvolatile memory. For example, the plurality of memory cells may be arranged in the three-dimensional manner at intersections of a plurality of word lines stacked to form word line groups and memory pillars passing through the word line group in a stacking direction.

In the nonvolatile memory, since it is possible to increase a storage capacitance by increasing the number of stacked layers of the word lines in the memory cell array, it is possible to reduce the necessity of using a more advanced patterning technology and thereby easily reduce cost per bit. In the case of increasing the number of stacked layers of the word lines, since the aspect ratio (=a dimension along a stacking direction/a dimension along a plane direction) of a sectional shape of the memory pillar becomes higher, the degree of machining difficulty may increase.

As a result, it has been considered to form the memory pillar by stacking a plurality of tiers. When the memory pillar is formed by stacking two tiers (an upper tier and a lower tier), the word line group is divided into two stacking units corresponding to the two tiers and thus a memory hole, in which the memory pillar is to be formed, is divided into an upper hole and a lower hole. Since the aspect ratio of the sectional shape of each of the upper hole and the lower hole is lower than that of the sectional shape of the entire memory hole, it is possible to reduce the degree of machining difficulty.

For example, a conductive layer provided as a word line and an insulating layer are alternately repeatedly stacked on a substrate to form a first stacking unit (hereinafter also referred to as "a first word line group"). The lower hole is formed in the first stacking unit by dry etching, insulating films (e.g., a block insulating film/a charge storage film/a tunnel insulating film) are deposited in the lower hole, the bottom portion of the insulating films is selectively removed, and then a semiconductor film is deposited to form a lower tier. Then, a conductive layer provided as a word line and an insulating layer are alternately repeatedly stacked on the lower tier to form a second stacking unit (hereinafter also referred to as "a second word line group"). The upper hole is formed at a location of the second stacking unit, that is aligned with the lower hole of the first stacking unit, by dry etching to expose the upper end of the lower tier. Then, insulating films (e.g., a block insulating film/a charge storage film/a tunnel insulating film) are deposited in the upper hole, the bottom portion of the insulating films is selectively removed, and then a semiconductor film is deposited to form the upper tier.

In the fabrication of the memory pillar with a structure in which a plurality of tiers are stacked, the dimension in the plane direction of the memory pillar differs in a discontinuous manner in the stacking direction. In such a case, a stacking unit includes one word line group of a plurality of word lines arranged in the stacking direction. The tier is a columnar structure constituting a part of the memory pillar. The grouped word line groups and the tiers correspond to each other in a one-to-one manner as described above. In the present embodiment, the tier disposed on the upper side of the memory pillar is referred to as the upper tier and the tier disposed on the lower side of the memory pillar is referred to as the lower tier. When the plurality of word lines are grouped into two word line groups in the stacking direction, the upper tier corresponds to an upper word line group and the lower tier corresponds to a lower word line group. An inter-tier boundary indicates a location between the plurality of tiers vertically adjacent to each other, and a part in which the dimension in the plane direction of the memory pillar is discontinuously changed in the stacking direction when viewed from above. Furthermore, the inter-tier boundary corresponds to a part (that is, a boundary of the stacking units), in which an interval in the stacking direction between word lines adjacent to each other in the stacking direction is locally large. A "vicinity of the inter-tier boundary" indicates an area including the inter-tier boundary and having a certain degree of spatial extent. A "boundary area" indicates an area (for example, a boundary area 1112 illustrated in FIG. 5 or FIG. 7) including a boundary of one or more stacking units in the stacking direction and having a certain degree of spatial extent.

In this regard, the term "the vicinity of the inter-tier boundary" is used when referring to read characteristics. The vicinity of the inter-tier boundary includes an area having a spatial extent toward the upper side from the inter-tier boundary and the same spatial extent toward the lower side from the inter-tier boundary. The term "the boundary area" is used when referring to control of a read operation mode and the boundary area is determined according to the control policy. Thus, the boundary area may include an area having a spatial extent toward the upper side from the boundary of the stacking units an inter-tier boundary) and a different spatial extent toward the lower side from the boundary of the stacking units. The boundary area may not include an area lower than a lower end of the lowermost tier in the memory pillar but may include an area higher than the lower end of the lowermost tier in the memory pillar (an area including a word line WL0). Furthermore, the boundary area may not include an area higher than an upper end of the uppermost tier in the memory pillar but may include an area lower than the upper end of the uppermost tier in the memory pillar (an area including a word line WL95).

Due to the manufacturing method (e.g., dry etching and the like) thereof, for example, the dimensions of the tiers in the plane direction in the memory pillar differ from each other between the upper end and the lower end. To maintain a certain positioning margin despite the dimension difference, the dimension of the lower end of the upper tier in the plane direction may be made smaller than that of the upper end of the lower tier adjacent in the stacking direction, and the dimension of the memory pillar in the plane direction may be discontinuously changed through the inter-tier boundary. With this, read characteristics in a memory cell in the vicinity of the tier boundary in the memory cell array are changed, so that the reliability of a data read operation from the memory cell array may be reduced.

With this, a fail bit count (FBC) corresponding to the number of error bits may be high in the vicinity of the tier boundary, and there is a possibility that the reliability of the data read operation from the memory cell array will be reduced.

The read operation may be carried out according to an adjacent-word-line compensation read mode in place of a typical read mode. The adjacent-word-line compensation read mode can enhance the reliability of the read operation as compared to the typical read mode, but it may increase the read time required for the read operation and thus reduce the performance.

For example, as illustrated in FIG. 1 and FIGS. 2A to 2C, the typical read mode may include a fast read mode, a normal read mode, and the like. FIG. 1 is a diagram conceptually illustrating a relationship between a read time of each read mode and reliability. FIGS. 2A to 2C are diagrams illustrating a period tR during which a ready/busy signal RBn indicates a busy state Bsy in each read mode. The ready/busy signal RBn is a signal indicating whether the nonvolatile memory is in a ready state Rdy (a state in which it is possible to receive an external command) or the busy state Bsy (a state in which it is not possible to receive any external command).

The normal read mode is the read mode of a typical read operation. The fast read mode is the read mode of a read operation in which a read time is shortened by shortening an application time and the like of a read level as compared to the normal read mode. The normal read mode can enhance the reliability of the read operation as compared to the fast read mode, but it may increase the time required for the read operation. The adjacent-word-line compensation read mode can enhance the reliability of the read operation as compared to the normal read mode, but it may increase the time required for the read operation. For example, FIG. 2A illustrates the period tR of the busy state Bsy in the fast read mode, FIG. 2B illustrates the period tR of the busy state Bsy in the normal read mode, and FIG. 2C illustrates the period tR of the busy state Bsy in the adjacent-word-line compensation read mode. As illustrated in FIGS. 2A to 2C, the period tR may be referred to as a period from the start of a sensing operation to the completion of the sensing operation in each read mode in the nonvolatile memory. The period tR of the fast read mode is shorter than that of the normal read mode, and the period tR of the normal read mode is shorter than that of the adjacent-word-line compensation read mode.

The adjacent-word-line compensation read mode is the read mode that compensates for an influence from a memory cell in an adjacent word line. In the adjacent-word-line compensation read mode, data is read from an adjacent memory cell (i.e., a memory cell connected to an adjacent word line) and then data is read from the target memory cell, which is connected to a target word line, using a plurality of read voltages. Alternatively, in the adjacent-word-line compensation read mode, data is read from a target memory cell at a predetermined read voltage while changing a read pass voltage applied to an adjacent word line. Furthermore, in the adjacent-word-line compensation read mode, on the basis of the data read from the adjacent memory cell, one read data of the target memory cell is selected from a plurality of candidate read data of the target memory cell. Lastly, in the adjacent-word-line compensation read mode, a read voltage is adjusted in consideration of an influence from the adjacent memory cell and the adjusted read voltage is applied to a word line connected to a memory cell to be read. With this, in the adjacent-word-line compensation read mode, it is possible to reduce the fail bit count (FBC) as compared to the typical read mode (for example, the fast read mode, the normal read mode, and the like), but the time required for the read operation becomes longer due to the read operation from the adjacent memory cell and the read operation for obtaining a plurality of candidate read data.

Therefore, when a read operation of an entire unit of memory cells (for example, an entire physical block of memory cells) in a memory cell array is performed in the adjacent-word-line compensation read mode (i.e., not only for a memory cell in the vicinity of a tier boundary), there is a possibility that performance will be unnecessarily reduced (for example, an increase in the period tR).

In this regard, in the present embodiment, in the memory system, the adjacent-word-line compensation read mode is applied to a memory cell in the vicinity of a tier boundary in a limited manner, so that it is possible to improve the reliability of a read operation while also preventing the reduction of performance.

Specifically, in the memory system, when a host read command is received from a host, a controller determines a physical location to be read. When the physical location to be read is in the vicinity of the tier boundary, the controller issues a read command requesting a read operation based on the adjacent-word-line compensation read mode, to the nonvolatile memory. When the physical location to be read is not in the vicinity of the tier boundary, the controller issues a read command requesting a read operation in the typical read mode, to the nonvolatile memory. With this, the controller applies the adjacent-word-line compensation read mode to the memory cell in the vicinity of the tier boundary in a limited manner, so that it is possible to improve the reliability of read data from the memory cell in the vicinity of the tier boundary. In addition, the controller applies the typical read mode to a memory cell not in the vicinity of the tier boundary, so that it is possible to improve the performance of a read operation (i.e., to shorten the period tR) relative to the case of applying the adjacent-word-line compensation read mode to all memory cells in the entire physical block. That is, it is possible to improve the reliability of the read operation while preventing a reduction in performance.

Figure 3:
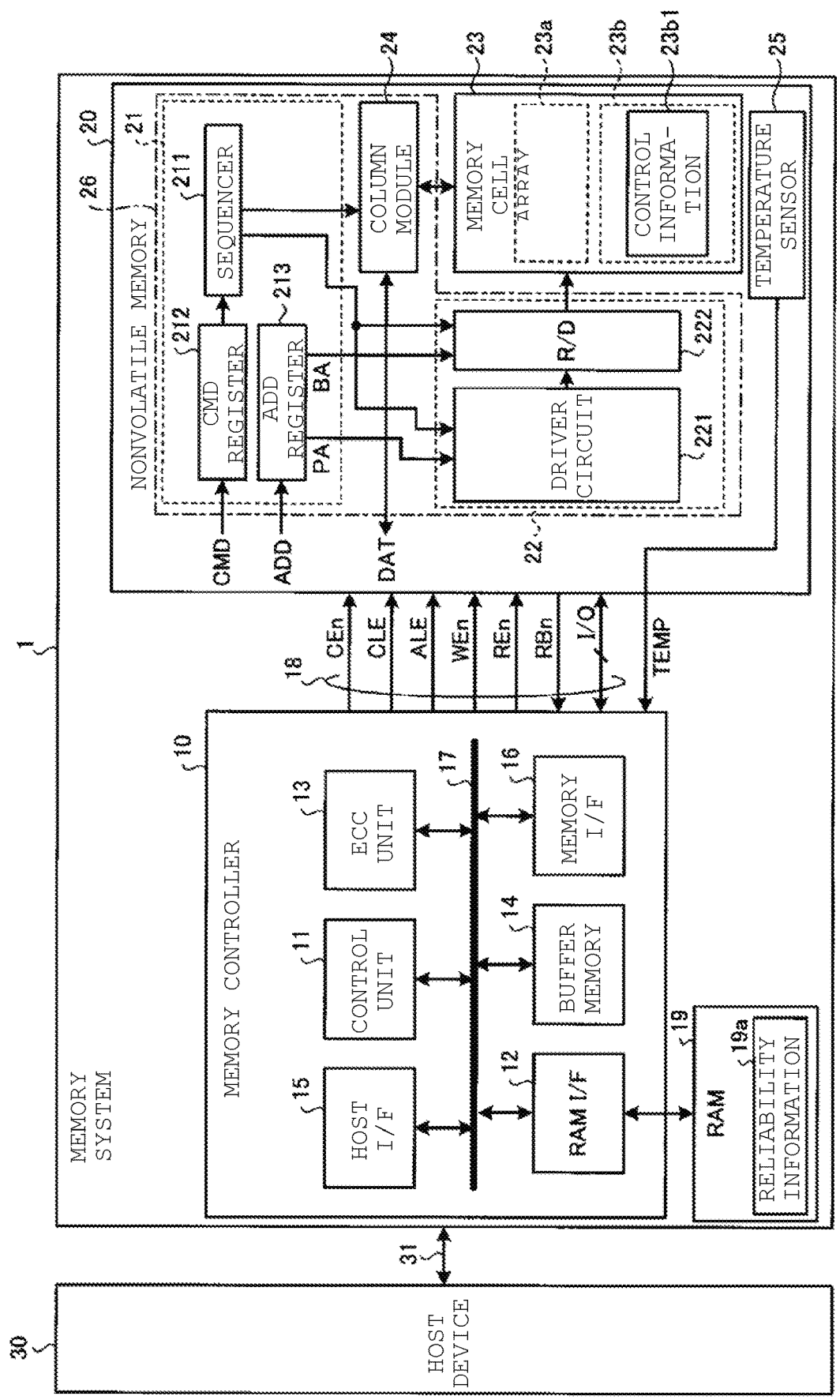
FIG. 3 is a diagram illustrating a configuration of a memory system according to an embodiment.

More specifically, a memory system 1 of the embodiment is configured as illustrated in FIG. 3. FIG. 3 is a diagram illustrating the configuration of the memory system 1.

The memory system 1 has a nonvolatile memory 20, a memory controller 10, and a random access memory (RAM) 19. The memory system 1 is connectable to a host device 30 and FIG. 3 illustrates a state in which the memory system 1 is connected to the host device 30. The host device 30 may be, for example, an electronic device such as a personal computer or a portable terminal.

The memory system 1 may be various memory systems that includes a nonvolatile memory, such as a solid state drive (SSD) or a memory card in which a memory controller and the nonvolatile memory are integrated into one package.

The nonvolatile memory 20 is a nonvolatile memory that stores data in a nonvolatile manner, and for example, is a NAND type flash memory (hereinafter, also referred to as a NAND memory). Although the following description will illustrate examples where the nonvolatile memory 20 is a NAND memory, the nonvolatile memory 20 may also be any other storage medium, such as a resistive random access memory (ReRAM), a ferroelectric random access memory (FeRAM), or a magneto resistive random access memory (MRAM).

The memory controller 10 is, for example, a semiconductor integrated circuit configured as a system-on-a-chip (SOC). Some or all of the functions of each element of the memory controller 10 to be described below may be implemented as a central processing unit (CPU) executing firmware or may be implemented in dedicated hardware.

The memory controller 10 is connected to the nonvolatile memory 20 by a memory bus 18 and is connected to the host device 30 by a host bus 31. The memory controller 10 controls a write operation to the nonvolatile memory 20 according to a host write command from the host device 30. Furthermore, the memory controller 10 controls a read operation from the nonvolatile memory 20 according to a host read command from the host device 30. The host device 30 may have a configuration of a computer. The computer may be, for example, a personal computer, a server device, a portable information device, a digital still camera, and the like. Furthermore, the host bus 31 conforms to, for example, any standard such as a serial advanced technology attachment (SATA), a serial attached SCSI (SAS), a peripheral component interconnect express (PCIe®), and NVM express (NVMe®).

The memory bus 18 performs signal transmission/reception between the memory controller 10 and the nonvolatile memory 20 according to a memory interface standard. When the memory interface standard conforms to a so-called NAND interface standard, specific examples of the signals include a chip enable signal CEn, a command latch enable signal CLE, an address latch enable signal ALE, a write enable signal WEn, a read enable signal REn, a ready/busy signal RBn, an input/output signal I/O, and the like. Herein, n at the end of each reference symbol indicates that the signal is negative logic, that is, the signal is active at a low level.

The signal CEn is a signal for enabling the nonvolatile memory 20. The signal CLE is a signal for notifying the nonvolatile memory 20 that the signal I/O is a command. The signal ALE is a signal for notifying the nonvolatile memory 20 that the signal I/O is an address. The signal WEn is a signal for notifying the nonvolatile memory 20 that the signal I/O is to be used as an input signal into the nonvolatile memory 20. The signal REn is a signal for notifying the nonvolatile memory 20 that the signal I/O is to be used as an output signal from the nonvolatile memory 20. The ready/busy signal RBn is a signal indicating whether the nonvolatile memory 20 is in a ready state (a state in which it is possible to receive a command from the memory controller 10) or a busy state (a state in which it is not possible to receive any command from the memory controller 10). The signal I/O is, for example, an 8-bit signal. The signal I/O includes data transmitted/received between the nonvolatile memory 20 and the memory controller 10, such as a command, an address, write data (data to be written to the nonvolatile memory 20), and read data (data that is read from the nonvolatile memory 20).

Furthermore, a signal TEMP indicating temperature measured by a temperature sensor 25 for measuring the temperature of the nonvolatile memory 20 is also output to the memory controller 10 from the nonvolatile memory 20. The temperature sensor 25 may be provided in the nonvolatile memory 20 as illustrated in FIG. 3, or may be an independent component provided outside the nonvolatile memory 20. Furthermore, a signal line, through which the signal TEMP output from the temperature sensor 25 is transmitted, may be provided in the memory bus 18 (for example, I/O) or may be an independent signal line separate from the memory bus 18.

The memory controller 10 has a host interface (host I/F) 15, a RAM interface (RAM I/F) 12, a buffer memory 14, a memory interface (memory I/F) 16, and an ECC unit 13. The host I/F 15, the RAM I/F 12, the buffer memory 14, the memory I/F 16, and the ECC unit 13 are each circuits and connected to one another by an internal bus 17.

The host I/F 15 is connected to the host device 30 via the host bus 31, and transmits a command and data received from the host device 30 to a control unit 11 and the buffer memory 14, respectively. The host I/F 15 transmits data in the buffer memory 14 to the host device 30 in response to a request of the control unit 11.

The control unit 11 includes, for example, a central processing unit (CPU) and controls the operations of each part of the memory controller 10. For example, when a host write command is received from the host device 30, the control unit 11 issues a write command to the memory I/F 16 in response to the host write command. When a host read command is received from the host device 30, the control unit 11 issues a read command to the memory I/F 16 in response to the host read command. For an erase operation, for example, the control unit 11 issues an erase command to the memory I/F 16 as a part of a process such as garbage collection (also referred to as compaction). In addition to the garbage collection, the control unit 11 controls the execution of various processes for managing the nonvolatile memory 20, such as wear leveling, refresh, and patrol read.

When a host command is received from the host device 30 via the host I/F 15, the control unit 11 performs control corresponding to the host command. For example, in response to the host write command from the host device 30, the control unit 11 instructs the memory I/F 16 to perform a data write operation on the nonvolatile memory 20. Furthermore, in response to the host read command from the host device 30, the control unit 11 instructs the memory I/F 16 to perform a read operation on the nonvolatile memory 20.

When a host write command is received from the host device 30, the control unit 11 determines a storage location in the nonvolatile memory 20 for the user data stored in the buffer memory 14 as write data. That is, the control unit 11 manages a write destination of the user data. The correspondence between a logical address of user data received from the host device 30 and a physical address indicating the storage location storing the user data on the nonvolatile memory 20 is managed by address conversion information stored in a look-up table (LUT). The LUT is, for example, stored in the nonvolatile memory 20, read as needed, and cached in the buffer memory 14, the RAM 19, and the like. Furthermore, the LUT may be updated when an operation is performed on the nonvolatile memory 20 (e.g., a write operation in response to a host write command from the host device 30).

When a host read command is received from the host device 30, the control unit 11 converts a logical address specified by the host read command to a physical address by using the LUT, and instructs the memory I/F 16 to perform a read operation from the physical address.

The memory I/F 16 is connected to the nonvolatile memory 20 via the memory bus 18 and controls communication with the nonvolatile memory 20. The memory I/F 16 outputs the signal ALE, the signal CLE, the signal WEn, and the signal REn to the nonvolatile memory 20 on the basis of a command received from the control unit 11. Furthermore, during a write operation, the memory I/F 16 transmits a write command issued by the control unit 11 and write data in the buffer memory 14 to the nonvolatile memory 20 as the signal I/O. During a read operation, the memory I/F 16 transmits a read command issued by the control unit 11 to the nonvolatile memory 20 as the signal I/O. Furthermore, the memory I/F 16 receives data read from the nonvolatile memory 20 as the signal I/O, and transmits the read data to the buffer memory 14.

The buffer memory 14 serves as a memory area where the write data or the read data is temporarily stored. The buffer memory 14 may be a dynamic random access memory (DRAM), or a static random access memory (SRAM).

The RAM I/F 12 is a circuit that controls access to the RAM 19 from the memory controller 10, and for example, is a controller that enables access to the RAM 19 at a double data rate (DDR).

The RAM 19 is a memory available as a working memory that stores the LUT, master tables (that is, snapshots) such as various management tables read and loaded from a specific area of the nonvolatile memory 20 at startup and the like, log information which includes changes in various management tables, and the like. Furthermore, the RAM 19 may also be used as a cache memory when data is transmitted between the host device 30 and the nonvolatile memory 20. The RAM 19 may have a memory capacity larger than that of the buffer memory 14. The RAM 19 may be composed of a dynamic random access memory (DRAM), or a static random access memory (SRAM).

The ECC unit 13 is a circuit that performs data encoding on the write data and decoding on the read data for error detection and error correction. Specifically, the ECC unit 13 encodes data to be written into the nonvolatile memory 20 (write data). Furthermore, the ECC unit 13 decodes data read from the nonvolatile memory 20 (read data). The ECC unit 13 performs error detection and error correction on the read data by decoding. When the error correction fails, the ECC unit 13 notifies the control unit 11 of the failure of the error correction. As an algorithm for the encoding and decoding by the ECC unit 13, any algorithm using Reed-Solomon (RS) codes, a Bose-Chaudhuri-Hocquenghem (BCH) codes, low density parity check (LDPC) codes, and the like, may be applied.

During a write operation, for example, the ECC unit 13 receives user data to be written into the nonvolatile memory 20 by a write command under the control of the control unit 11, generates parity on the basis of the user data, and adds the parity to the user data. The user data including the parity is written in the nonvolatile memory 20 as coded data.

During a read operation, the ECC unit 13 receives read data read from the nonvolatile memory 20 by a read command under the control of the control unit 11, obtains parity from the read data, generates a syndrome on the basis of the parity, and determines the presence or absence of error bits in the read user data. When the error bits are included in the user data, the ECC unit 13 determines the positions of the error bits. The number of error bits correctable in the ECC unit 13 is determined by the number of bits of the parity, and the like. When the number of error bits is equal to or less than the number of correctable error bits, the ECC unit 13 corrects the error bits and notifies the control unit 11 of success of the correction. When the number of error bits exceeds the number of correctable error bits, the ECC unit 13 determines that error correction is not possible and notifies the control unit 11 of the correction failure.

The nonvolatile memory 20 has a memory cell array 23, a control circuit 26, and the temperature sensor 25. The control circuit 26 has a command processing unit 21, a driving unit 22, and a column module 24. The command processing unit 21 includes a sequencer 211, a command register (a CMD register) 212, and an address register (an ADD register) 213. The driving unit 22 includes a driver circuit 221 and a row decoder (R/D) 222.

A partial area of the memory cell array 23 is allocated as a management information storage area 23b capable of storing management information, and the other area is allocated as a storage area 23a capable of storing user data. The management information storage area 23b, for example, stores control information 23b1 for performing the adjacent-word-line compensation read.

The R/D 222 selects a block to be accessed and further selects a location in the selected block in a row direction.

The driver circuit 221 supplies a voltage to the selected block via the R/D 222.

The column module 24, for example, includes a sense amplifier and a data latch having a plurality of latch circuits. The column module 24 transmits write data DAT received from the memory controller 10 to the memory cell array 23 during a write operation. Furthermore, during a read operation, the column module 24 senses data read from the memory cell array 23, and performs necessary arithmetic operations. Then, the column module 24 outputs the obtained data DAT to the memory controller 10.

The ADD register 213 stores an address ADD received from the memory controller 10. The CMD register 212 stores a command CMD received from the memory controller 10.

The sequencer 211 controls the entire operation of the nonvolatile memory 20 on the basis of the command CMD stored in the CMD register 212.

The temperature sensor 25 measures the temperature around the memory cell array 23 periodically or at a necessary timing, and outputs a signal TEMP indicating the detected temperature to the memory controller 10.

Next, a unit of data management in the nonvolatile memory 20 will be described.

The nonvolatile memory 20 (see FIG. 3) may be composed of a plurality of memory chips. Each of the memory chips has memory cell arrays. The memory cell array 23 (see FIG. 3) represents an aggregate of the memory cell arrays of each memory chip. In the memory cell array of each memory chip, a physical page is a unit in which data may be collectively written or read. In the case of a full sequence program, a group (for example, a memory cell group MCG illustrated in FIG. 4) including a plurality of memory cells sharing a word line is a unit in which data may be collectively written. A physical block including a plurality of physical pages is a minimum unit in which data may be independently erased. When memory chips are connected to 8 channels ch0 to ch7, for example, the memory controller 10 can control the channels ch0 to ch7 in parallel. The channel refers to a physical path (a physical channel) for transmitting a signal. Furthermore, the memory controller 10 can perform a plurality of parallel operations for each of the channels ch0 to ch7 by bank interleaving, for example, in a 2-bank parallel manner. With this, one logical page can be configured as a data recording area with 16 physical pages (=8 channels×2 banks) in which write/read is almost collectively possible in parallel, and one logical block may be configured as a data block with 16 physical blocks in which erase is almost collectively possible in parallel. The garbage collection (compaction) may be performed in units of one logical block.

Furthermore, it is assumed that data in the nonvolatile memory 20 is managed by the control unit 11 in units of a cluster, which is a data management unit smaller than one physical page. The size of one cluster may be equal to or more than that of a sector, which is a minimum access unit employed by the host device 30. A natural multiple of the cluster size is determined to be equal to a physical page size. For example, one physical page is composed of four clusters and one logical page is composed of 64 clusters.

In addition, in the LUT used in conversion between a logical address and a physical address for accessing the nonvolatile memory 20, the logical address and the physical address are correlated with each other. The logical address, for example, may be a logical block address (LBA). The physical address may be a combination of identification information of a logical block (for example, a logical block ID) and identification information of a logical cluster (for example, a logical page ID+a logical cluster ID). A unit of the conversion of the LUT is, for example, a cluster.

Figure 4:
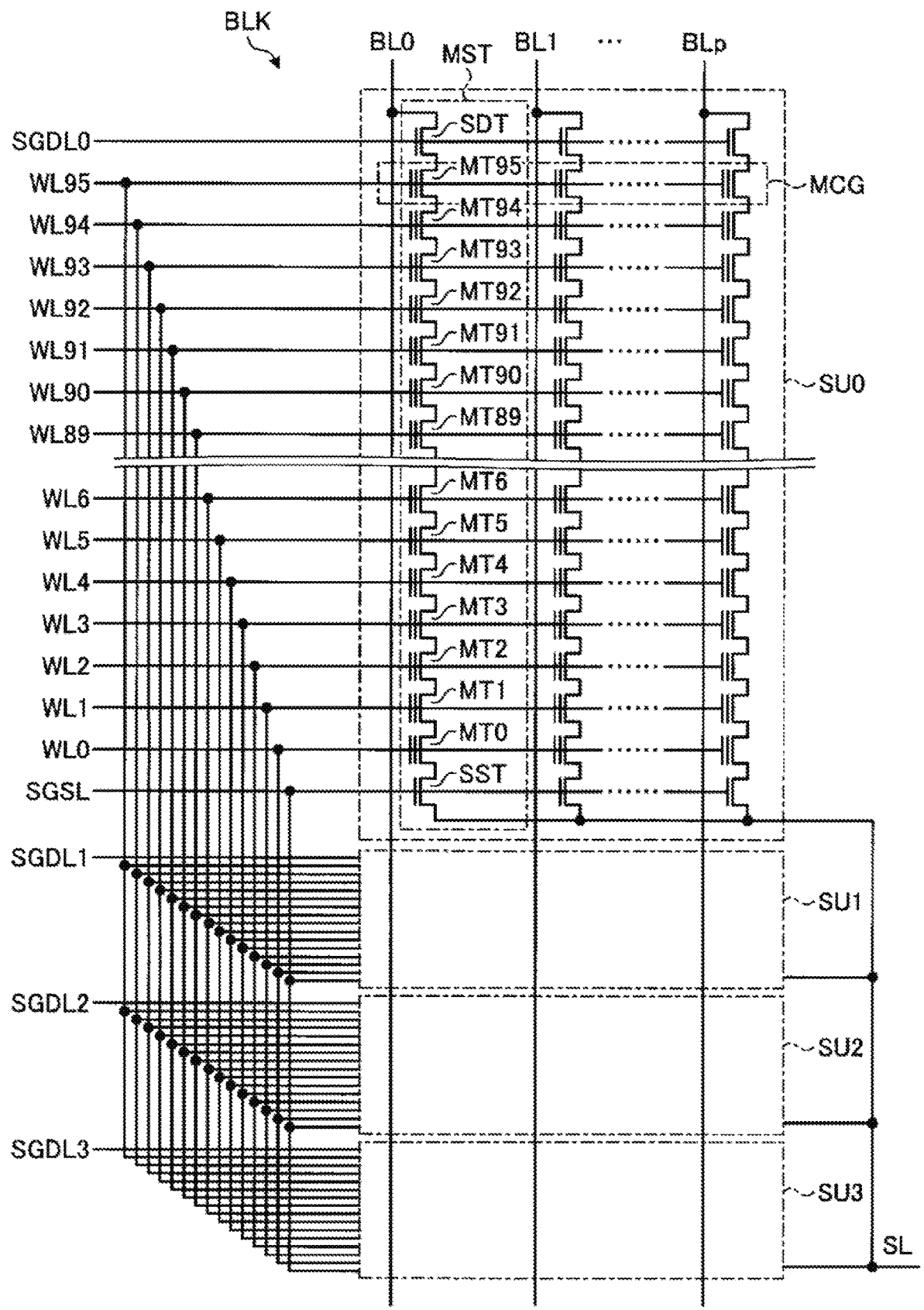
FIG. 4 is a circuit diagram illustrating a configuration of each physical block in the embodiment.

Each physical block in the memory cell array of each memory chip, for example, is configured as a circuit. FIG. 4 is a circuit diagram illustrating a configuration of each physical block BLK.

Each physical block BLK has a plurality of string units SU0 to SU3. The plurality of string units SU0 to SU3 correspond to a plurality of select gate lines SGDL0 to SGDL3, respectively, and share a select gate line SGSL. Each of the string units SU0 to SU3 serves as a driving unit in the physical block BLK. Each of the string units SU0 to SU3 may be driven by a corresponding select gate line of the plurality of select gate lines SGDL0 to SGDL3 and the select gate line SGSL. Furthermore, each of the string units SU0 to SU3 includes a plurality of memory strings MST.

Each of the memory strings MST, for example, includes 96 memory cell transistors MT (MT0 to MT95) and select transistors SDT and SST. The memory cell transistor MT has a control gate and a charge storage film, and stores data in a nonvolatile manner. The 96 memory cell transistors MT (MT0 to MT95) are serially connected to one another between a source of the select transistor SDT and a drain of the select transistor SST. The number of memory cell transistors MT in each memory string MST is not limited to 96.

Each of word lines WL0 to WL95 (notated as WL when word lines are not distinguished from one another) is commonly connected to the control gate of the memory cell transistors MT in the memory strings MST of each string unit SU of the physical block BLK. In other words, the control gate of the memory cell transistors MT in the same row in each string unit SU of the physical block BLK is connected to the same word line WL. That is, the string unit SU of the physical block BLK includes a plurality of memory cell groups MCG corresponding to a plurality of word lines WL, and each of the memory cell groups MCG includes (p+1) memory cell transistors MT connected to the same word line WL. When each of the memory cell transistors MT is controlled to store a 1-bit value (i.e., when operating in a single level cell (SLC) mode), the (p+1) memory cell transistors MT connected to the same word line WL (that is, the memory cell group MCG) are handled as one physical page, and a data write operation and a data read operation are performed for each physical page.

Each of the memory cell transistors MT may be controlled to store a multiple-bit value. For example, when each of the memory cell transistors MT is controlled to store an n-bit value (n≥2), a storage capacity per word line WL is equal to the size of n physical pages. That is, each of the memory cell groups MCG includes n physical pages. For example, in a multi-level cell (MLC) mode in which each of the memory cell transistors MT stores a 2-bit value, data corresponding to 2 physical pages is stored in each word line WL. Alternatively, in a triple-level cell (TLC) mode in which each of the memory cell transistors MT stores a 3-bit value, data corresponding to 3 physical pages is stored in each word line WL.

Figure 5:
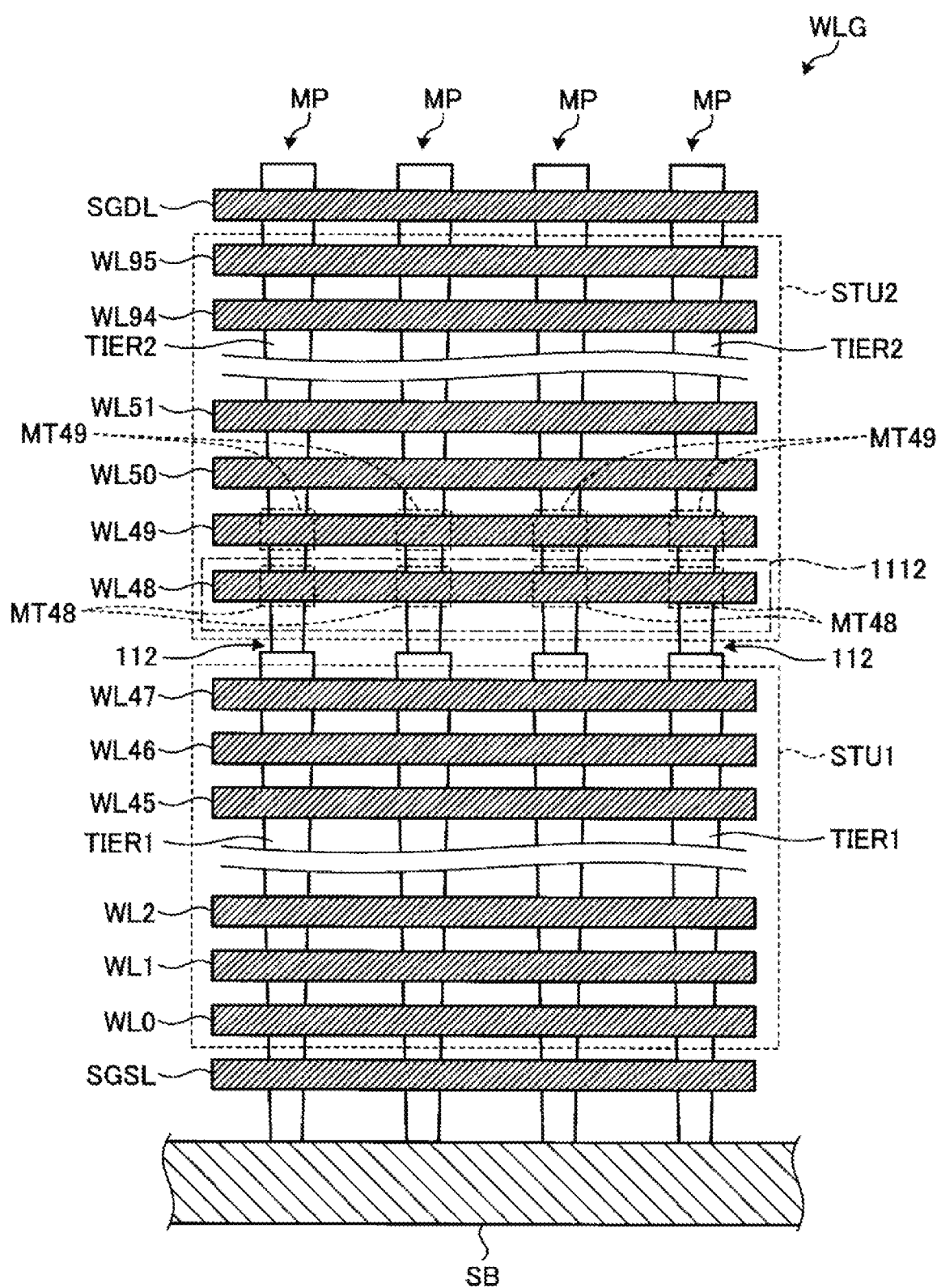
FIG. 5 is a sectional view illustrating a plurality of stacking units in each physical block in the embodiment.

In the memory cell array illustrated in FIG. 3 and FIG. 4, a plurality of memory cells are arranged in a three-dimensional manner at intersection locations of a plurality of word lines stacked to form word line groups and memory pillars passing through the word line group in a stacking direction. The word line group may be divided into a plurality of stacking units. Each physical block in the memory cell array of each memory chip may be structurally configured as illustrated in FIG. 5. FIG. 5 is a sectional view illustrating a plurality of stacking units in each physical block.

In the memory cell array illustrated in FIG. 5, a word line group WLG is disposed on a substrate SB. In the word line group WLG, a plurality of word lines WL0, WL1, . . . , WL47, WL48, WL49, . . . , WL94, and WL95 are sequentially stacked. In the word line group WLG, the plurality of word lines may be divided into a plurality of stacking units. The number of word lines in each stacking unit may not be or may not be the same after the division.

In the memory cell array, a plurality of memory pillars MP are arranged in a plane direction. Each of the memory pillars MP extends in the stacking direction and may be structured by stacking a plurality of tiers of pillars. The word line group WLG may be divided into a plurality of stacking units corresponding to the plurality of tiers of pillars.

In the case of FIG. 5, in each of the memory pillars MP, a tier TIER1 and a tier TIER2 are sequentially stacked. The word line group WLG is divided into a stacking unit STU1 and a stacking unit STU2. The stacking unit STU1 corresponds to the tier TIER1 and includes a plurality of word lines WL0 to WL47. The number of word lines WL in the stacking unit STU1 is 48 (96/2). The stacking unit STU2 corresponds to the tier TIER2 and includes a plurality of word lines WL48 to WL95. The number of word lines WL in the stacking unit STU2 is 48 (96/2).

In addition, although not illustrated in FIG. 5 for the purpose of simplification, bit lines, via wires electrically connecting the memory pillars MP and the bit lines, and the like are arranged above the memory pillars MP.

In each tier of the memory pillar MP, the dimension of the memory pillar MP in the plane direction of an upper end may be smaller than that of a lower end. The dimension of the memory pillar MP in the plane direction may have a monotonic decreasing trend from the upper end to the lower end of each tier, or a monotonic decreasing trend after a monotonic increasing trend when viewed from the upper end to the lower end. Accordingly, the dimension of the memory pillar MP in the plane direction, in which the plurality of tiers TIER1 and TIER2 are stacked, may be discontinuously changed in the stacking direction.

In the case of FIG. 5, the dimension of the memory pillar MP in the plane direction of the lower end of the tier TIER2 is smaller than that of the upper end of the tier TIER1. When viewed from the upper end of the tier TIER2 to the lower end of the tier TIER1, the dimension of the memory pillar MP in the plane direction is sharply increased in the vicinity of a boundary (a tier boundary) 112 between the tier TIER2 and the tier TIER1, and thus is discontinuously changed in the vicinity of the tier boundary 112.

With this, when the memory cell array is viewed in the stacking direction, an electric field between the control gate and the channel area in the memory cell during a read operation may be discontinuously changed in the vicinity of the tier boundary. Therefore, in the memory cell array, read characteristics may be changed in memory cells in the vicinity of the tier boundary. When a boundary area of a plurality of stacking units is defined in correspondence to the vicinity of a tier boundary, read characteristics may be changed in memory cells formed at intersection locations of word lines and memory pillars provided in the boundary area. The boundary area may include one word line close to the tier boundary. In the case of FIG. 5, in a boundary area 1112 between the stacking unit STU1 and the stacking unit STU2, there is one word line WL48 close to the tier boundary 112 on the upper side of the tier boundary 112 (i.e., the tier TIER2 side). In the memory cell MT48 formed at an intersection location of the word line WL48 and the memory pillar MP, read characteristics may be changed.

In contrast, the memory system 1 has a function of turning on and off the adjacent-word-line compensation read mode for each predetermined data management unit (for example, a unit of a physical block as illustrated in FIG. 5). Thus, the memory system 1 generates in advance the control information 23*b*1 (see FIG. 7) in which a physical location of a memory cell in the vicinity of a tier boundary (a physical location of a memory cell connected to a word line in a boundary area) is set as an area to which the adjacent-word-line compensation read mode is to be applied (hereinafter, also referred to as an application target area), and stores the control information 23*b*1 in the management information storage area 23*b* (see FIG. 1) of the memory cell array 23. At the time of an initialization operation such as at startup, the memory system 1 may read the control information 23*b*1 from the management information storage area 23*b*, store the control information 23*b*1 in the RAM 19, and refer to the control information 23*b*1 stored in the RAM 19 as needed. Then, the memory system 1 determines whether a memory area to be read is included in the application target area, and applies the adjacent-word-line compensation read mode when the memory area to be read is included in the application target area. With this, the memory system 1 may apply the adjacent-word-line compensation read mode to the memory cell in the vicinity of the tier boundary in a limited manner.

Figure 6:
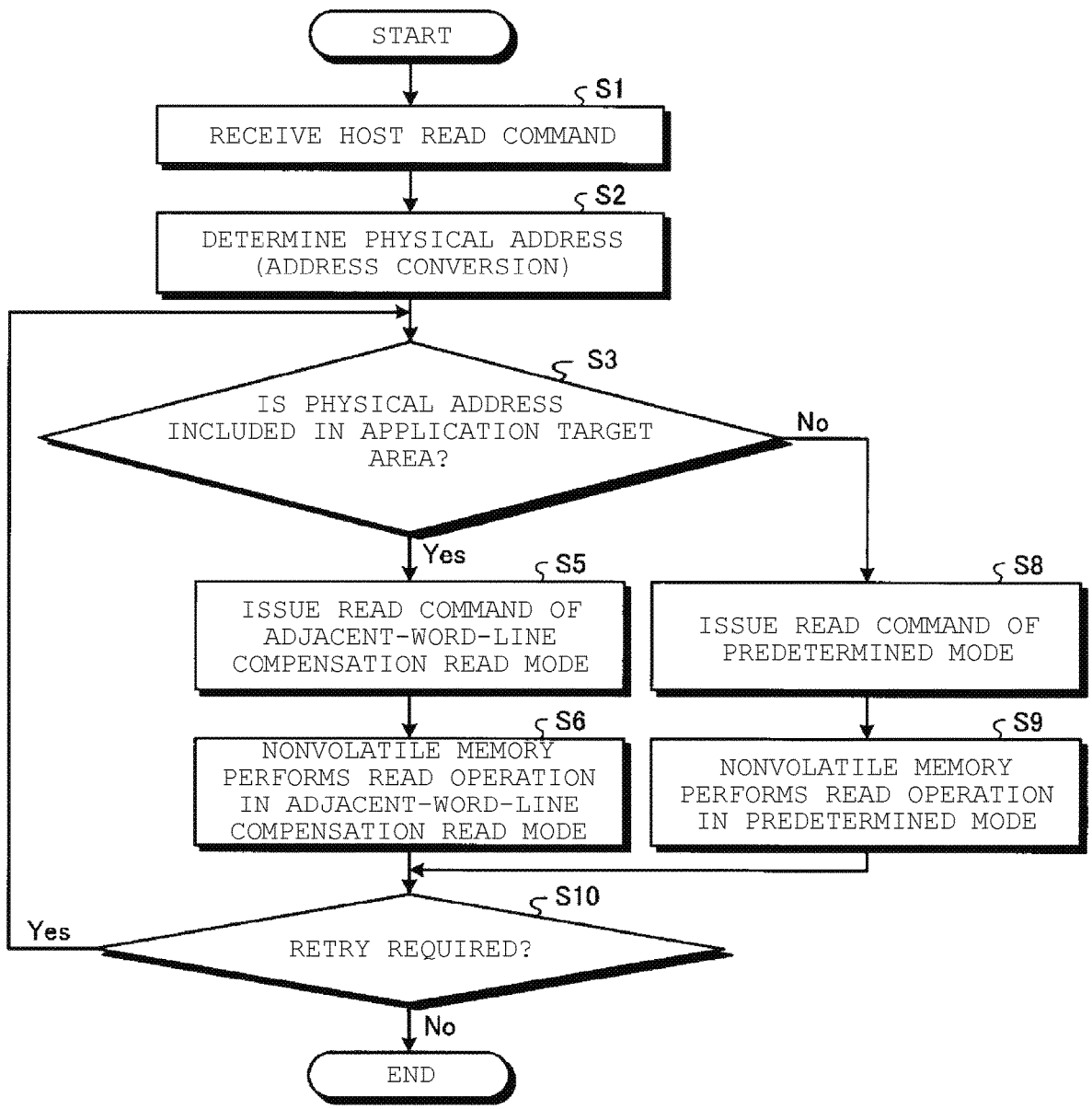
FIG. 6 is a flowchart illustrating an operation of the memory system according to the embodiment.

The memory system 1 may operate as illustrated in FIG. 6. FIG. 6 is a flowchart illustrating an operation of the memory system 1.

In the memory system 1, when the host read command is received from the host device 30 (S1), the memory controller refers to the address conversion information LUT and performs address conversion for determining a physical address corresponding to a logical address included in the host read command (S2). The memory controller 10 refers to the control information 23b1 and determines whether the physical address converted in S2 is included in the application target area (S3).

Figure 7:
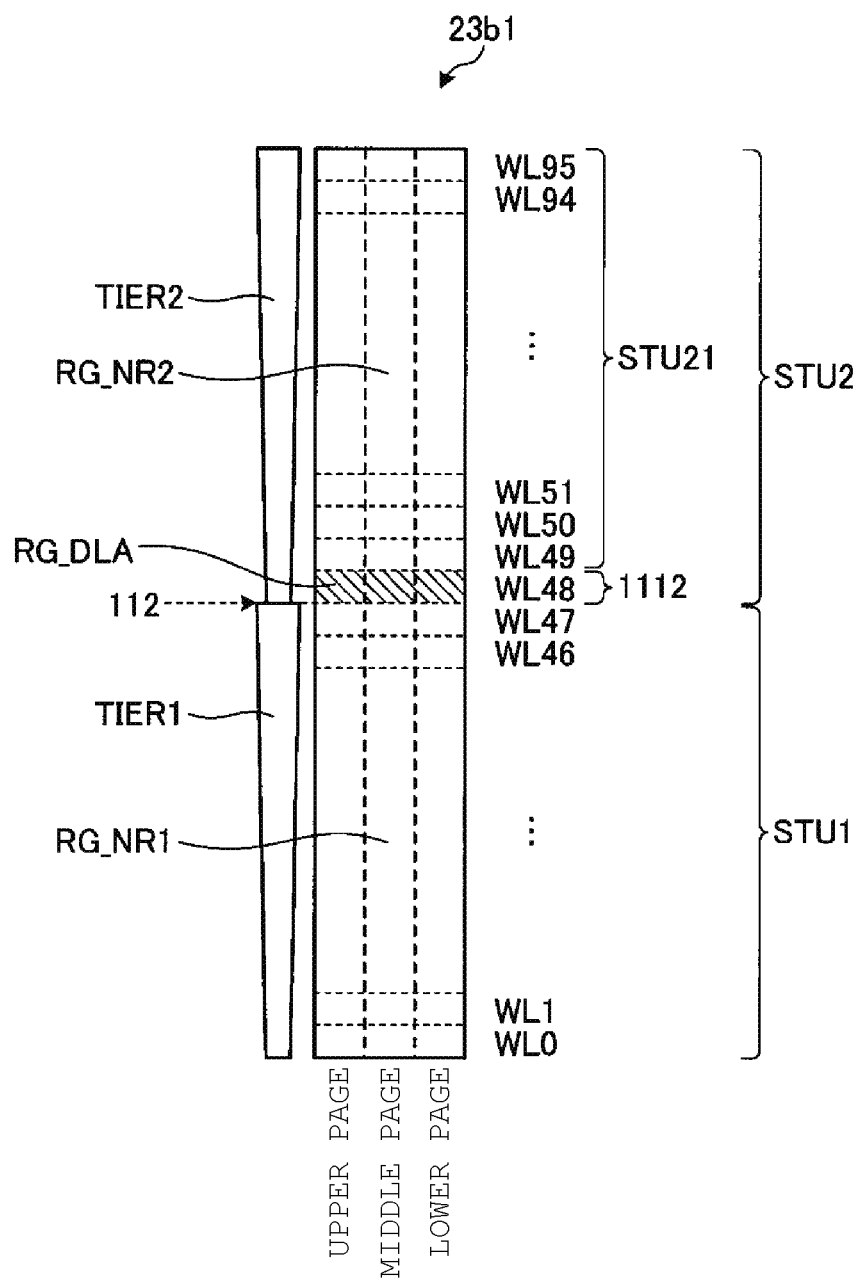
FIG. 7 is a conceptual diagram illustrating control information used in the embodiment.

As illustrated in FIG. 7 and FIG. 8, in the control information 23b1, a physical location and information indicating ON and OFF of the adjacent-word-line compensation read mode are correlated with a plurality of physical locations in the memory cell array. FIG. 7 is a conceptual diagram illustrating the control information 23b1. In FIG. 7, an application target area RG_DLA is indicated by hatching. The application target area RG_DLA indicates a range of the physical location of memory cells in the vicinity of the tier boundary 112, and indicates a range of the physical location of memory cells connected to a word line in the boundary area 1112. The control information 23b1 illustrated in FIG. 7 indicates that it is necessary to apply the adjacent-word-line compensation read mode when a memory cell to be read is provided in the application target area RG_DLA.

A normal area RG_NR1 illustrated in FIG. 7 indicates a range of the physical location of memory cells connected to a word line in the stacking unit STU1 corresponding to the tier TIER1. A normal area RG_NR2 indicates a range of the physical location of memory cells connected to a word line in an area STU21, except for the boundary area 1112, of the stacking unit STU2 corresponding to the tier TIER2. The control information 23b1 illustrated in FIG. 7 indicates that it is not necessary to apply the adjacent-word-line compensation read mode (that is, a typical read operation is to be carried out) when a memory cell to be read is provided in the normal area RG_NR1 or the normal area RG_NR2.

Furthermore, in consideration of a case where each memory cell transistor MT is controlled to store a multiple-bit value, the control information 23b1 may include information indicating whether to apply the adjacent-word-line compensation read mode to read each of multiple bits. FIG. 7 illustrates a case where each memory cell transistor MT is programmed in the triple-level cell (TLC) mode, and illustrates 3-bit data corresponding to three physical pages (an UPPER page, a MIDDLE page, and a LOWER page).

The control information 23b1 conceptually illustrated in FIG. 7, for example, may be implemented in the form of a table as illustrated in FIG. 8. FIG. 8 is a diagram illustrating an implementation form of the control information 23b1. In FIG. 8, the control information 23b1 has a word line identification information field 23b11, a page identification information field 23b12, and an application designation field 23b13. In the word line identification information field 23b11, information for identifying a word line (for example, a word line ID) is recorded. In the page identification information field 23b12, information for identifying a physical page (for example, information indicating an UPPER page, a MIDDLE page, or a LOWER page) is recorded. In the application designation field 23b13, ON is recorded when it is necessary to apply the adjacent-word-line compensation read mode, and OFF is recorded when it is not necessary to apply the adjacent-word-line compensation read mode.

Return back to FIG. 6. When the physical address converted in S2 is included in the application target area ("Yes" in S3), the memory controller 10 issues a read command requesting a read operation based on the adjacent-word-line compensation read mode, and supplies the read command to the nonvolatile memory 20 (S5).

In response to the read command of S5, the nonvolatile memory 20 performs the read operation on a target memory cell in the adjacent-word-line compensation read mode, and transmits the read data to the memory controller 10 (S6). For example, when a read target is the memory cell MT48 connected to the word line WL48, the nonvolatile memory 20 reads data from the adjacent memory cell MT49 connected to the adjacent word line WL49, and sequentially reads data from the target memory cell MT48 connected to the target word line WL48 at a plurality of read voltages. The plurality of pieces of data sequentially read at the plurality of read voltages is regarded as candidate read data to be selected in the adjacent-word-line compensation read mode. Then, on the basis of the data read from the adjacent memory cell MT49, the nonvolatile memory 20 selects one read data among the plurality of pieces of candidate read data of the target memory cell MT48 for each memory pillar (that is, each bit line). With this, the nonvolatile memory 20 selects one read data, in which an influence from the memory cell connected to the adjacent word line is compensated, from the plurality of pieces of candidate read data, and transmits the selected read data to the memory controller 10. In this way, it is possible to improve the reliability of the read operation for the memory cell in the vicinity of the tier boundary.

This process may be performed in the memory controller 10. For example, when a read target is the memory cell MT48 connected to the word line WL48, the nonvolatile memory 20 may read data from the adjacent memory cell MT49 connected to the adjacent word line WL49, sequentially read data from the target memory cell MT48 connected to the target word line WL48 at a plurality of read voltages, and transmit the read data to the memory controller 10. The plurality of pieces of data sequentially read at the plurality of read voltages is regarded as candidate read data to be selected in the adjacent-word-line compensation read mode. Then, on the basis of the data read from the adjacent memory cell MT49, the memory controller 10 selects one read data among the plurality of pieces of candidate read data of the target memory cell MT48 for each memory pillar (that is, each bit line). With this, the memory controller 10 selects one read data, in which an influence from the memory cell connected to the adjacent word line is compensated, from the plurality of pieces of candidate read data. In this way, it is possible to improve the reliability of the read operation for the memory cell in the vicinity of the tier boundary.

In contrast, when the physical address converted in S2 is not included in the application target area ("No" in S3), the memory controller 10 issues a read command requesting a read operation in the typical read mode (for example, the fast read mode, the normal read mode, and the like), and supplies the read command to the nonvolatile memory 20 (S8).

In response to the read command of S8, the nonvolatile memory 20 performs the read operation on the target memory cell in the typical read mode, and transmits the read data to the memory controller 10 (S9). With this, it is possible to prevent the unnecessary reduction of performance (for example, an increase in the period tR).

The memory controller 10 receives the read data from the nonvolatile memory 20, and determines whether to perform a retry read operation on the basis of the read data (S10). The retry read operation refers to a read operation that is performed again due to correction failure in error correction on the read data from the nonvolatile memory 20 in the read operation. The memory controller 10 performs error correction on the read data obtained in S6 or S9, and when the correction fails, the memory controller 10 returns the process to S3 because it is required to perform the retry read operation ("Yes" in S10). When the correction is successful, the memory controller 10 transmits the read result to the host device 30 because it is not required to perform the retry read operation ("No" in S10), and ends the process.

As described above, according to the present embodiment, in the memory system 1, the adjacent-word-line compensation read mode is applied to the memory cell MT48 in the vicinity of the tier boundary 112 in a limited manner, thereby maintaining a typical read operation for a memory cell not in the vicinity of the tier boundary 112. With this, it is possible to improve the reliability of the read operation in the nonvolatile memory 20 and prevent the reduction of performance.

In the read operation of S5 and S6, and of S8 and S9 of FIG. 6, a shift read mode may be used to shift a read level. In S6, the read operation may also be performed in the adjacent-word-line compensation read mode while changing the read level. In S9, the read operation may also be performed in the fast read mode or the normal read mode while changing the read level.

In S5 and S8 of FIG. 6, the read operation may also be performed according to a retry sequence. A first read operation is a first read operation in the retry sequence, and its trigger is a host read command, or an internal read instruction associated with a compaction process, a refresh process, and the like. On the other hand, the retry read operation is a second and subsequent read operations in the retry sequence, and is different in that it is triggered as a result of uncorrectable error in the read data. Furthermore, in the retry read operation, the read operation is often performed at a read level changed from the previous read level. The retry read operation is often performed in a more reliable mode compared to the first read operation. For example, when the fast read mode is performed in the first read operation, the normal read mode or the adjacent-word-line compensation read mode is performed in the retry read operation. When the normal read mode is performed in the first read operation, the adjacent-word-line compensation read mode is performed in the retry read operation.

Figure 9:
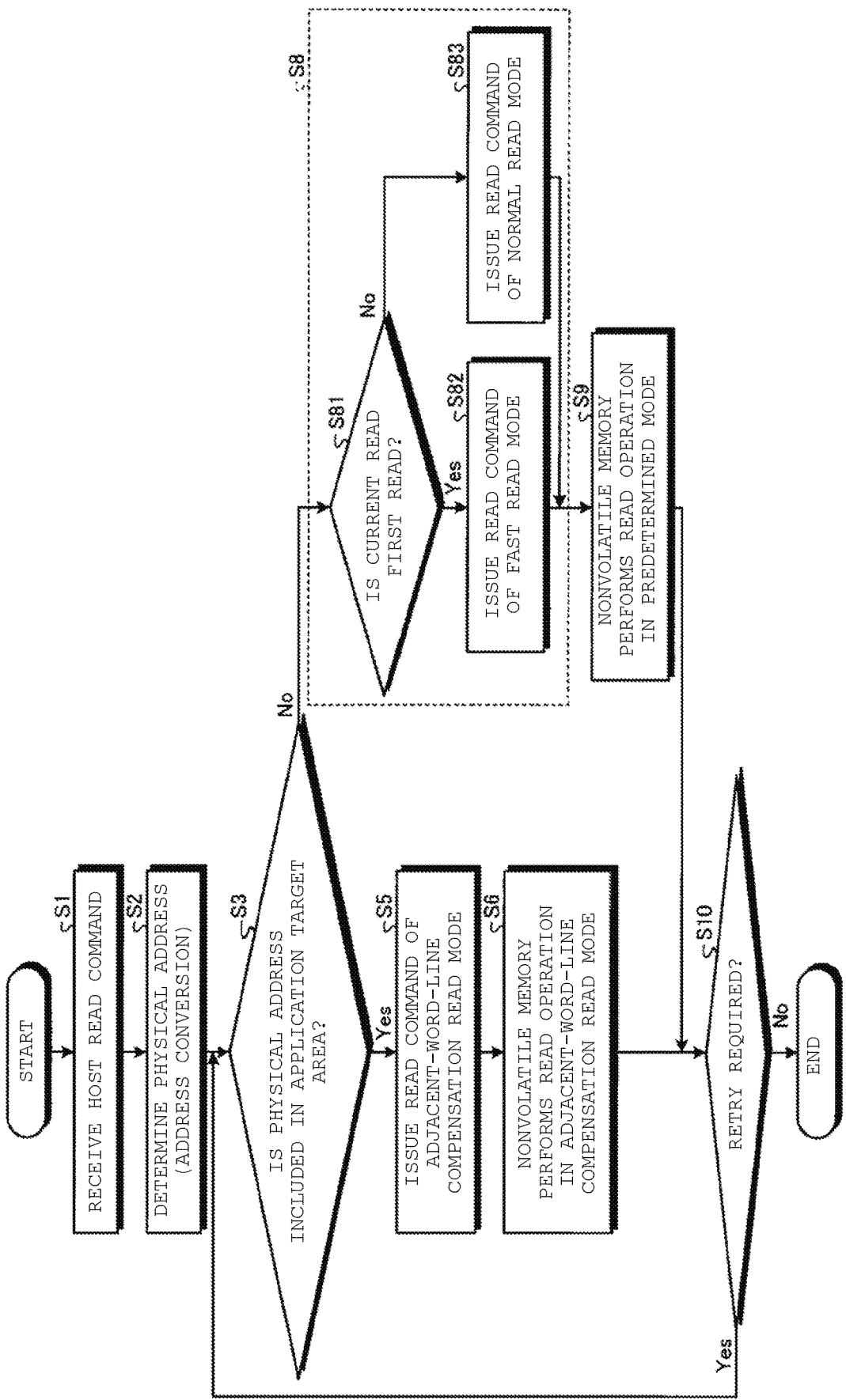
FIG. 9 is a flowchart illustrating an operation of the memory system according to a first modification example of the embodiment.

As a first modification example of the embodiment, the memory system 1 may perform an operation as illustrated in FIG. 9. FIG. 9 is a flowchart illustrating an operation of the memory system 1 according to the first modification example of the embodiment. FIG. 9 illustrates a case where a threshold value of the number of retries is four, the first read operation is determined to be performed in the fast read mode and a retry read operation is determined to be performed in the normal read mode as a more reliable mode in the retry sequence. When the physical address converted in S2 is not included in the application target area ("No" in S3), processes of S81 to S83 may be performed in S8. That is, the memory controller 10 determines whether the current read operation is the first read operation (S81). When the current read operation is the first read operation ("Yes" in S81), the memory controller 10 determines a read mode as the fast read mode based on a reference read level, issues a read command, and supplies the issued read command to the nonvolatile memory 20 (S82). In response to the read command of S82, the nonvolatile memory 20 performs a read operation on the target memory cell in the fast read mode, and transmits the read data to the memory controller 10 (S9). The memory controller 10 performs error correction on the read data obtained in the first execution of S9 (that is, the first read operation). When the correction fails, the memory controller 10 proceeds to S8 via S3 because it is required to perform a retry read operation (employing the correction failure as a trigger) ("Yes" in S10). Since the current read operation is the second read operation ("No" in S81), the memory controller 10 determines a read mode to the normal read mode based on a read level different from that of the first read operation, issues a second read command, and supplies the issued read command to the nonvolatile memory 20 together with a shift value for setting the read level (S83). In response to the read command of S83, the nonvolatile memory 20 performs a read operation on the target memory cell in the normal read mode (S9). The nonvolatile memory 20 transmits the read data to the memory controller 10. The memory controller 10 performs error correction on the read data obtained in the second execution of S9 (that is, the first retry read operation). When the correction fails, the memory controller 10 proceeds to S8 via S3 because it is required to perform another retry read operation ("Yes" in S10). Since the current read operation is the third read operation ("No" in S81), the memory controller 10 determines a read mode to the normal read mode based on a read level different from those of the first and second read operations, issues a third read command, and supplies the issued read command to the nonvolatile memory 20 together with a shift value for setting the read level (S83). In response to the read command of S83, the nonvolatile memory 20 performs a read operation on the target memory cell in the normal read mode (S9). The nonvolatile memory 20 transmits the read data to the memory controller 10. The memory controller 10 performs error correction on the read data obtained in the third S9 (that is, the second retry read operation). When the correction fails, the memory controller 10 proceeds to S8 via S3 because it is required to perform still another retry read operation ("Yes" in S10). Since the current read operation is the fourth read operation ("No" in S81), the memory controller 10 determines a read mode to the normal read mode based on a read level different from those of the first to third read operations, issues a fourth read command, and supplies the issued read command to the nonvolatile memory 20 together with a shift value for setting the read level (S83). In response to the read command of S83, the nonvolatile memory 20 performs a read operation on the target memory cell in the normal read mode (S9). The nonvolatile memory 20 transmits the read data to the memory controller 10. The memory controller 10 performs error correction on the read data obtained in the fourth S9 (that is, the third retry read operation). When the correction fails, the memory controller 10 proceeds to S8 via S3 because it is required to perform still another retry read operation ("Yes" in S10). Since the current read operation is the fifth read operation ("No" in S81), the memory controller 10 determines the read mode to be the normal read mode with a read level different from those of the first to fourth read operations, issues a fifth read command, and supplies the issued read command to the nonvolatile memory 20 together with a shift value for setting the read level (S83). In response to the read command of S83, the nonvolatile memory 20 performs a read operation on the target memory cell in the normal read mode (S9). The nonvolatile memory 20 transmits the read data to the memory controller 10. The memory controller 10 performs error correction on the read data obtained in the fifth execution of S9 (that is, the fourth retry read operation). When the correction fails, since the number of retries reaches the threshold value (here, four), the memory controller 10 determines that it is difficult to avoid an error in the retry read operation and it is not required to perform the retry read operation anymore("No" in S10), and ends the procedure.

As a modification example of FIG. 9, in S82, a read command may be issued in the normal read mode, and in S83, a read command may be issued in the adjacent-word-line compensation read mode. In a comparison between the modification examples of FIG. 6 and FIG. 9, the adjacent-word-line compensation read mode is applicable only in the application target area in FIG. 6, while it is applicable in the retry read operation even in a non-application target area in the modification example of FIG. 9.

Figure 10:
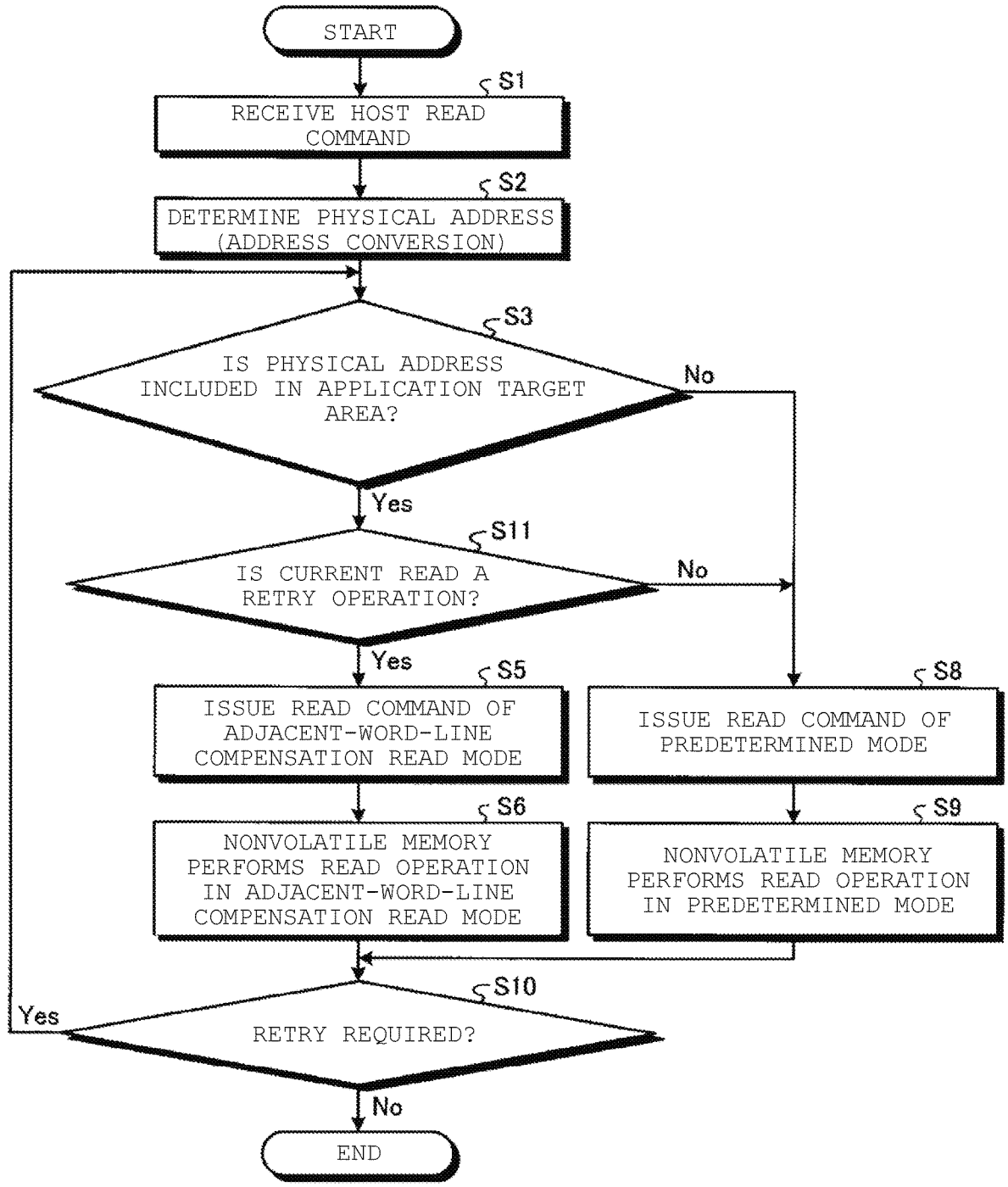
FIG. 10 is a flowchart illustrating an operation of the memory system according to a second modification example of the embodiment.

The adjacent-word-line compensation read mode may be applicable from a first read operation, or may not be applicable in a first read operation and may be applicable from a retry read operation as illustrated in FIG. 10. FIG. 10 is a flowchart illustrating an operation of the memory system 1 according to a second modification example of the embodiment. When FIG. 6 and FIG. 10 are compared with each other, a process of S11 is added in FIG. 10. With this, the adjacent-word-line compensation read mode is applicable regardless of the first read and the retry read in the operation illustrated in FIG. 6, but is not applicable in the first read and is applicable only to the retry read in an operation illustrated in FIG. 10. That is, as illustrated in FIG. 10, in the memory system 1, when the physical address converted in S2 is included in the application target area ("Yes" in S3), the memory controller 10 determines whether the current read operation is a retry read operation (S11). When the current read operation is the first read operation ("No" in S11), the memory controller 10 determines that the adjacent-word-line compensation read mode does not apply and proceeds to the process to S8. When the current read operation is the retry read operation ("Yes" in S11), the memory controller 10 determines that the adjacent-word-line compensation read mode does apply and issues a command of the adjacent-word-line compensation read mode (S5).

As described above, when the adjacent-word-line compensation read mode is applied to the memory cell MT48 in the vicinity of the tier boundary 112 in a limited manner in a read operation of the retry read operation, it is possible to further prevent the reduction of performance and to improve the reliability of the read operation in the nonvolatile memory 20.

Figure 11:
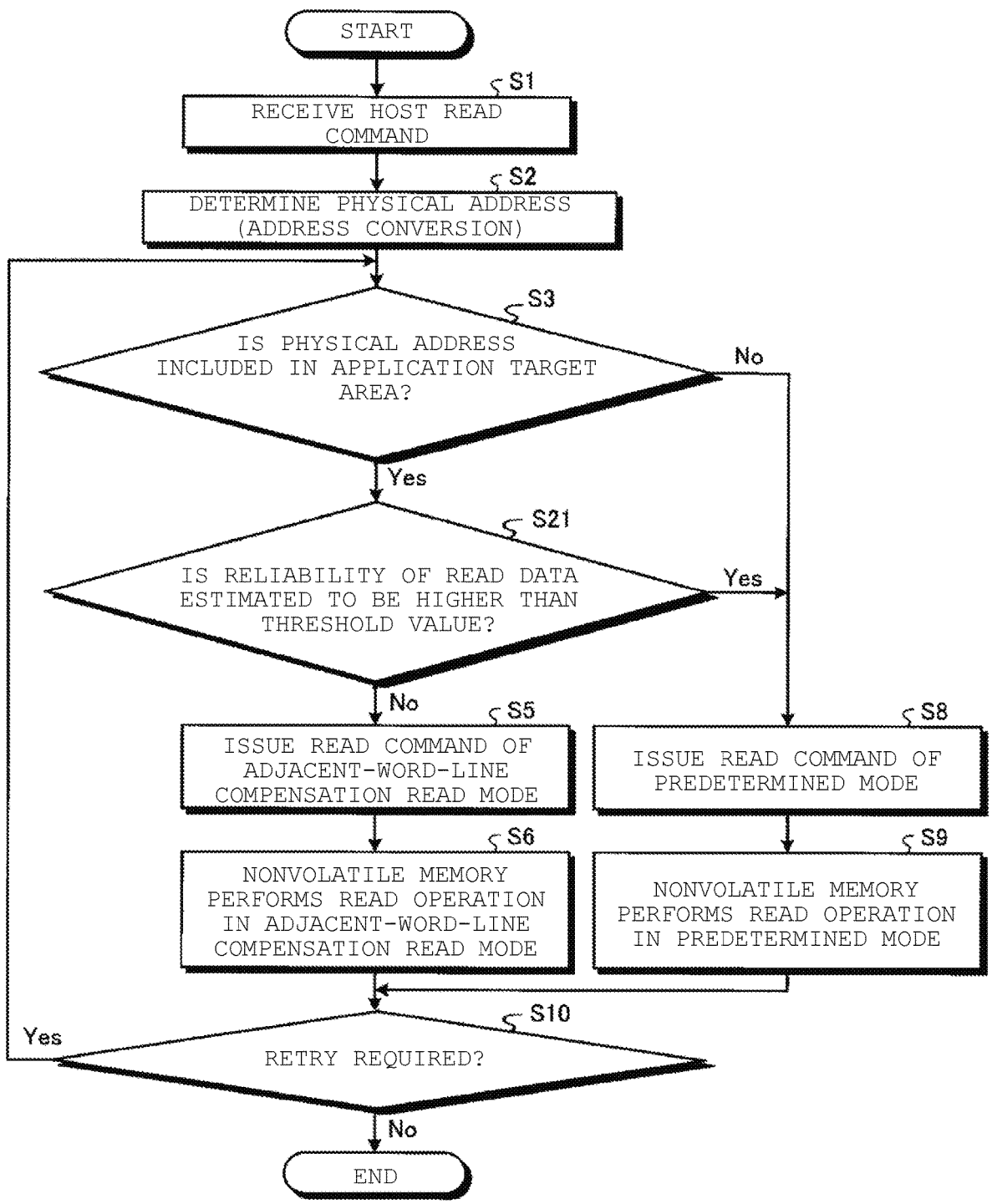
FIG. 11 is a flowchart illustrating an operation of the memory system according to a third modification example of the embodiment.

A condition for applying the adjacent-word-line compensation read mode may be a condition where information on the reliability of read data indicates reliability lower than a predetermined threshold value, as illustrated in FIG. 11. As illustrated in FIG. 3, reliability information 19*a* may be stored in the RAM 19, for example. The reliability information 19*a* is information indicating that the physical location of memory cells and characteristics (for example, a retry rate, the number of defective bits, and the like) indicating the reliability of read data are correlated for a plurality of different physical locations. In addition, the reliability information 19*a* is stored in the nonvolatile memory 20 (the management information storage area 23*b*), and is read into the RAM 19 by the memory controller 10 when the memory system 1 starts to operate. FIG. 11 is a flowchart illustrating an operation of the memory system 1 according to a third modification example of the embodiment. When FIG. 6 and FIG. 11 are compared with each other, a process of S21 is added in FIG. 11. With this, the adjacent-word-line compensation read mode is applicable regardless of the reliability of read data in the operation illustrated in FIG. 6, but is not applicable when the reliability of read data is high and is applicable only when the reliability of read data is low in an operation illustrated in FIG. 11. That is, in the memory system 1, when the physical address converted in S2 is included in the application target area ("Yes" in S3), the memory controller 10 determines whether information on the reliability of read data indicates reliability higher than a predetermined threshold value (S21). When the reliability of read data is higher than the predetermined threshold value ("Yes" in S21), the memory controller 10 determines that the adjacent-word-line compensation read mode does not apply and proceeds to the process of S8. When the reliability of read data is equal to or less than the predetermined threshold value ("No" in S21), the memory controller 10 determines that the adjacent-word-line compensation read mode does apply and issues a command of the adjacent-word-line compensation read mode (S5).

In addition, in FIG. 11, when it is determined that the reliability is low ("No" in S21) regardless of whether the physical address to be read is included in the application target area (that is, S3 may be omitted in FIG. 11), the memory controller 10 may issue the read command of the adjacent-word-line compensation read mode in S5.

In addition, in the operation of FIG. 11, the following determination may be made instead of the determination of S3 and S21. That is, when satisfying at least one of a first condition that the physical address converted in S2 is included in the application target area and a second condition that the physical address converted in S2 is not included in the application target area and the information on the reliability of read data indicates reliability lower than the predetermined threshold value, the procedure may proceed to S5, and when satisfying neither the first condition nor the second condition, the procedure may proceed to S8.

The information on the reliability of read data includes at least one of a bit error ratio detected in the error correction of the read data, a retry rate of the read operation in the nonvolatile memory 20, and the cumulative number of the read operation. The bit error ratio (BER) is an error occurrence probability per one bit and may be obtained by dividing the number of error bits of user data, which is detected by the ECC unit 13, by the total number of bits of the user data. The calculation of the bit error ratio, for example, may be performed for the number of error bits of user data with the size of an ECC frame (1 KB or 2 KB) or the size of a cluster (4 KB). Furthermore, the calculation of the bit error ratio may be performed for the number of error bits of user data, immediately after the program of a corresponding block, or the number of error bits of user data temporally averaged over a plurality of erasing operations of the corresponding block. The retry rate is an occurrence probability of retry read due to correction failure in the ECC unit 13 and may be obtained by dividing the number of times of retry read by the number of times of the first read operation performed. The cumulative number of the read operations, for example, is the cumulative number of the read operations that is counted in a predetermined data management unit (for example, for each physical block). The cumulative number may be reset during the erasing operation.

When the information on the reliability of read data indicates reliability more than the predetermined threshold value ("Yes" in S21), the memory controller 10 turns off the function of the adjacent-word-line compensation read mode and maintains the typical read mode (S8). When the information on the reliability of read data indicates reliability lower than the predetermined threshold value ("No" in S21), the memory controller 10 issues a read command of the adjacent-word-line compensation read mode (S5).

As described above, when the reliability of read data is lower than the predetermined threshold value, the adjacent-word-line compensation read mode is applied to the memory cell MT48 in the vicinity of the tier boundary 112 in a limited manner, so that it is possible to further prevent the reduction of performance and to improve the reliability of the read operation in the nonvolatile memory 20.

Figure 12:
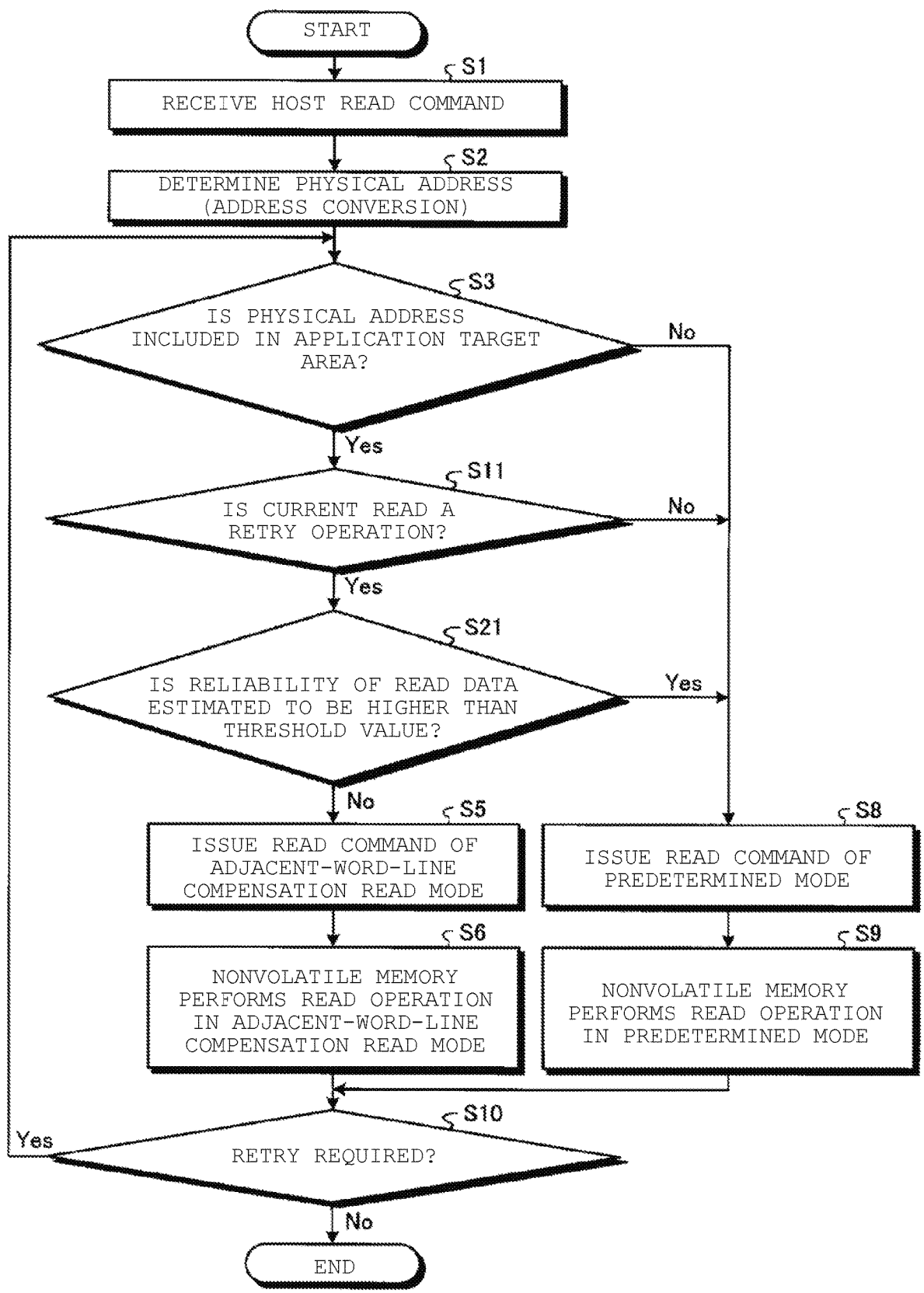
FIG. 12 is a flowchart illustrating an operation of the memory system according to a fourth modification example of the embodiment.

A condition for applying the adjacent-word-line compensation read mode may be a condition where information on the reliability of read data indicates reliability lower than a predetermined threshold value in a retry read operation, as illustrated in FIG. 12. FIG. 12 is a flowchart illustrating an operation of the memory system 1 according to a fourth modification example of the embodiment. When FIG. 6 and FIG. 12 are compared with each other, the process of S11 and the process of S21 are added in FIG. 12. With this, the adjacent-word-line compensation read mode is applicable regardless of the first read and a retry read in the operation illustrated in FIG. 6, but is not applicable in the first read and is applicable only to a retry read in an operation illustrated in FIG. 12. Furthermore, the adjacent-word-line compensation read mode is applicable regardless of the reliability of read data in the operation illustrated in FIG. 6, but is not applicable when the reliability of read data is high and is applicable only when the reliability of read data is low in the operation illustrated in FIG. 12. That is, in the memory system 1, when the physical address converted in S2 is included in the application target area ("Yes" in S3), the memory controller 10 determines whether the current read operation is a retry read operation (S11). When the current read operation is the first read operation ("No" in S11), the memory controller 10 turns off the function of the adjacent-word-line compensation read mode and maintains the typical read mode (S8). When the current read operation is the retry read operation ("Yes" in S11), the memory controller 10 determines whether information on the reliability of read data indicates reliability lower than the predetermined threshold value (S21).

When the information on the reliability of read data indicates reliability is equal to or higher than the predetermined threshold value ("Yes" in S21), the memory controller 10 turns off the function of the adjacent-word-line compensation read mode and issues a read command of the typical read mode (S8). When the information on the reliability of read data indicates reliability lower than the predetermined threshold value ("No" in S21), the memory controller 10 turns on the function of the adjacent-word-line compensation read mode and issues a read command of the adjacent-word-line compensation read mode (S5).

As described above, when the current read operation is the retry read operation and the reliability of read data is lower than the predetermined threshold value, the adjacent-word-line compensation read mode is applied to the memory cell MT48 in the vicinity of the tier boundary 112 in a limited manner, so that it is possible to further prevent the reduction of performance and to improve the reliability of the read operation in the nonvolatile memory 20.

An application target area where the adjacent-word-line compensation read mode is to be applied may be an area as illustrated in FIGS. 13A to 13D. FIGS. 13A to 13D are diagrams illustrating the control information 23b1 according to a fifth modification example of the embodiment.

Figure 13:
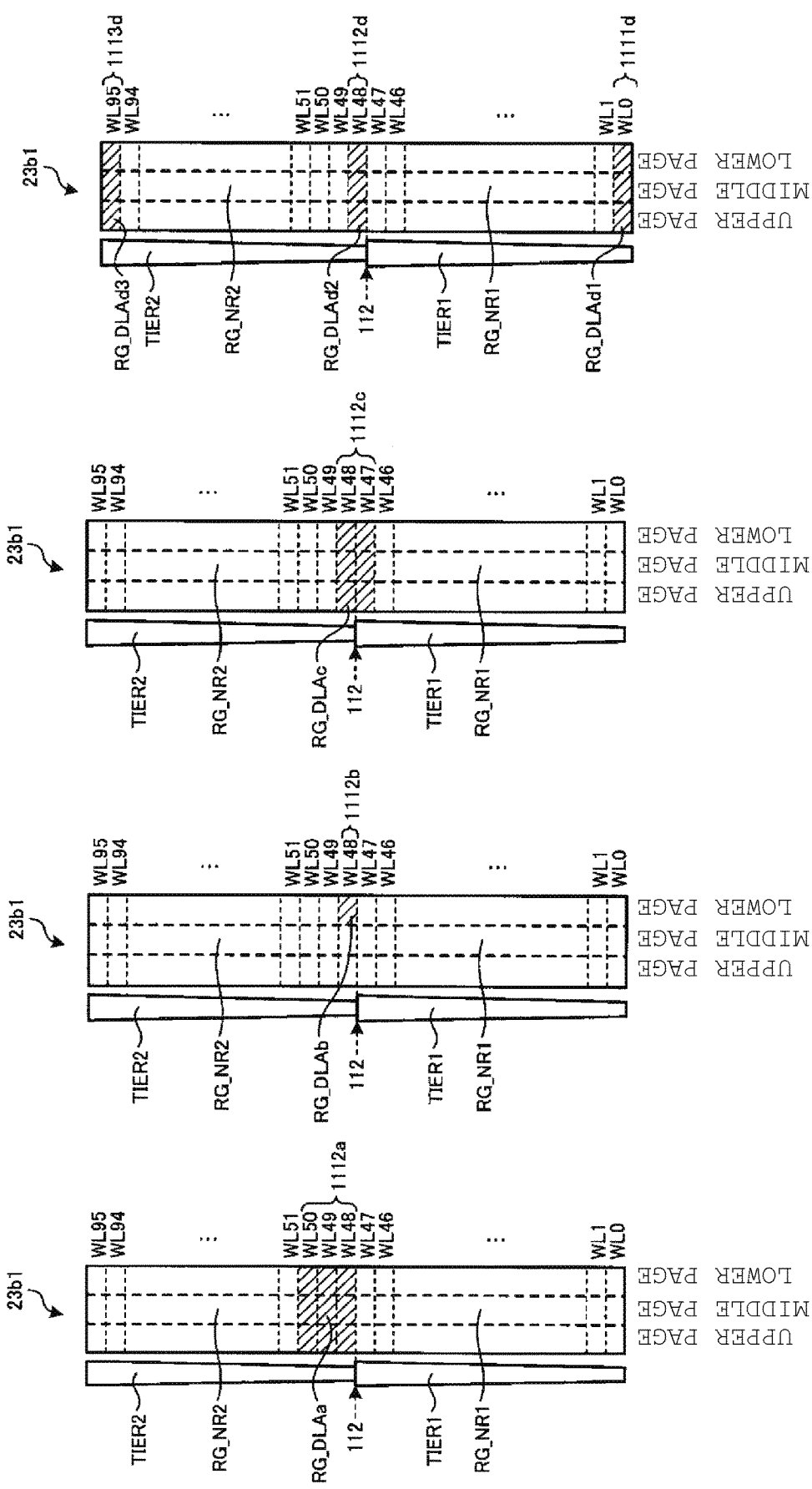
FIGS. 13A to 13D are conceptual diagrams illustrating the control information used in a fifth modification example of the embodiment.

As illustrated in FIG. 13A, a boundary area of a plurality of stacking units may include two or more word lines close to a tier boundary. In FIG. 13A, in a boundary area 1112a between the stacking unit STU1 and the stacking unit STU2, there are three word lines WL48 to WL50 close to the tier boundary 112 on the upper side of the tier boundary 112 (the tier TIER2 side). In the memory cells MT48 to MT50 formed at intersection locations of the word lines WL48 to WL50 and the memory pillar MP, read characteristics may be changed.

With this, in the control information 23b1 illustrated in FIG. 13A, an application target area RG_DLAa indicates a range of the physical location of the memory cells MT48 to MT50 connected to the word lines WL48 to WL50 in the boundary area 1112a. When a memory cell to be read is in the application target area RG_DLAa, the memory controller 10 may apply the adjacent-word-line compensation read mode by referring to the control information 23b1 illustrated in FIG. 13A.

As illustrated in FIG. 13B, a boundary area of a plurality of stacking units may include some pages corresponding to word lines close to a tier boundary. In FIG. 13B, in a boundary area 1112b between the stacking unit STU1 and the stacking unit STU2, there is one word line WL48 close to the tier boundary 112 on the upper side of the tier boundary 112 (the tier TIER2 side). For example, in a bit corresponding to the LOWER page of the memory cell MT48 formed at an intersection location of the word line WL48 and the memory pillar MP, read characteristics may be changed.

With this, in the control information 23b1 illustrated in FIG. 13B, an application target area RG_DLAb indicates a range of the physical location of the memory cells MT48 connected to the word line WL48 in the boundary area 1112b and a range of bits corresponding to some pages (for example, the LOWER page). In the control information 23b1 illustrated in FIG. 13B, in the memory cell MT48 connected to the word line WL48 in the boundary area 1112b, the adjacent-word-line compensation read mode is applied to the bits corresponding to some pages (for example, the LOWER page), and is not applied to bits corresponding to other pages (for example, a MIDDLE page and an UPPER page) (that is, the typical read operation is maintained). Consequently, by referring to the control information 23b1 illustrated in FIG. 13B, the adjacent-word-line compensation read mode is applied in a limited manner to the bit corresponding to some pages (for example, the LOWER page) in the memory cell MT48 corresponding to the boundary area 1112b, so that it is possible to further prevent the reduction of performance. Note that, some pages, to which the adjacent-word-line compensation read mode is applied in a limited manner, are not limited to the LOWER page illustrated in FIG. 13B, and may be the MIDDLE page, the UPPER page, or a set including two pages selected from the LOWER page, the MIDDLE page, and the UPPER page.

As illustrated in FIG. 13C, a boundary area of a plurality of stacking units may include two or more word lines close to a tier boundary. In FIG. 13C, in a boundary area 1112c between the stacking unit STU1 and the stacking unit STU2, there is one word line WL48 close to the tier boundary 112 on the upper side of the tier boundary 112 (the tier TIER2 side) and there is one word line WL47 close to the tier boundary 112 on the lower side of the tier boundary 112 (the tier TIER1 side). In the memory cells MT47 and MT48 formed at intersection locations of the word lines WL47 and WL48 and the memory pillar MP, read characteristics may be changed.

With this, in the control information 23*b*1 illustrated in FIG. 13C, an application target area RG_DLAc indicates a range of the physical location of the memory cells MT47 and MT48 connected to the word lines WL47 and WL48 in the boundary area 1112*c*. When a memory cell to be read is in the application target area RG_DLAc, the memory controller 10 may apply the adjacent-word-line compensation read mode by referring to the control information 23*b*1 illustrated in FIG. 13C.

As illustrated in FIG. 13D, a boundary area of a plurality of stacking units may include a word line close to a tier boundary, a word line corresponding to a lower end of the lowermost tier, and a word line corresponding to an upper end of the uppermost tier. In FIG. 13D, in a boundary area 1112*d* between the stacking unit STU1 and the stacking unit STU2, there is one word line WL48 close to the tier boundary 112 on the upper side of the tier boundary 112 (the tier TIER2 side). In a boundary area 1111*d* of the stacking unit STU1, there is one word line WL0 close to the lower end on the upper side of the lower end of the lowermost tier TIER1. In a boundary area 1113*d* of the stacking unit STU2, there is one word line WL95 close to the upper end on the lower side of the upper end of the uppermost tier TIER2. In the memory cells MT0, MT48, and MT95 formed at intersection locations of the word lines WL0, WL48, and WL95 and the memory pillar MP, read characteristics may be changed.

With this, in the control information 23*b*1 illustrated in FIG. 13D, an application target area RG_DLAd2 indicates a range of the physical location of the memory cells MT48 connected to the word line WL48 in the boundary area 1112*d*. An application target area RG_DLAd1 indicates a range of the physical location of the memory cells MT0 connected to the word line WL0 in the boundary area 1111*d*. An application target area RG_DLAd3 indicates a range of the physical location of the memory cells MT95 connected to the word line WL95 in the boundary area 1113*d*. When a memory cell to be read is in the application target area RG_DLAd2, the application target area RG_DLAd1, or the application target area RG_DLAd3, the memory controller 10 may apply the adjacent-word-line compensation read mode by referring to the control information 23*b*1 illustrated in FIG. 13D.

Figure 14:
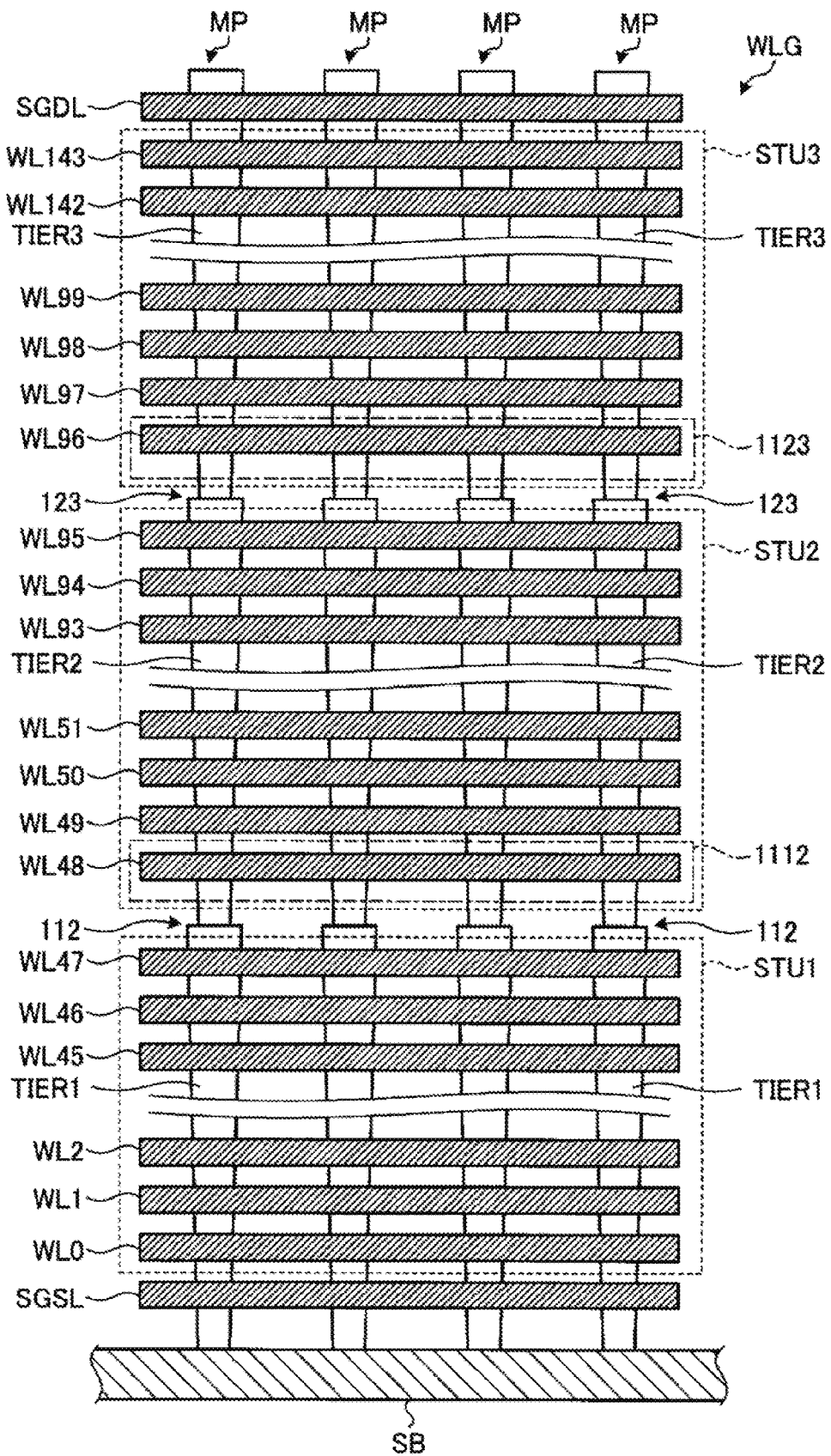
FIG. 14 is a sectional view illustrating a plurality of stacking units in a sixth modification example of the embodiment.

As illustrated in FIG. 14, each memory pillar MP may be structured by sequentially stacking a lower tier TIER1, a middle tier TIER2, and an upper tier TIER3, and thus a word line group WLG may be divided into a stacking unit STU1, a stacking unit STU2, and a stacking unit STU3. FIG. 14 is a sectional view illustrating a plurality of stacking units in a sixth modification example of the embodiment. The stacking unit STU1 and the stacking unit STU2 are to the same as those of the embodiment. The stacking unit STU3 corresponds to the tier TIER3 and includes a plurality of word lines WL96 to WL143.

In such a case, the dimension in the plane direction of a lower end of the tier TIER3 is smaller than that of an upper end of the tier TIER2, and the dimension in the plane direction of a lower end of the tier TIER2 is smaller than that of an upper end of the tier TIER1. The dimension in the plane direction of the memory pillar MP is sharply increased in the vicinity of a boundary (a tier boundary) 123 between the tier TIER3 and the tier TIER2 and thus is discontinuously changed in the vicinity of the tier boundary 123 when viewed from an upper end of the tier TIER3 to a lower end of the tier TIER1. Furthermore, the dimension in the plane direction of the memory pillar MP is sharply increased in the vicinity of the boundary (a tier boundary) 112 between the tier TIER2 and the tier TIER1 and thus is discontinuously changed in the vicinity of the tier boundary 112 when viewed from the upper end of the tier TIER3 to the lower end of the tier TIER1.

A boundary area may include one word line close to the tier boundary. In the case of FIG. 14, in the boundary area 1112 between the stacking unit STU1 and the stacking unit STU2, there is one word line WL48 close to the tier boundary 112 on the upper side of the tier boundary 112 (the tier TIER2 side). In a boundary area 1123 between the stacking unit STU2 and the stacking unit STU3, there is one word line WL96 close to the tier boundary 123 on the upper side of the tier boundary 123 (the tier TIER3 side). In the memory cells MT48 and MT96 formed at intersection locations of the word lines WL48 and WL96 and the memory pillar MP, read characteristics may be changed.

Figure 15:
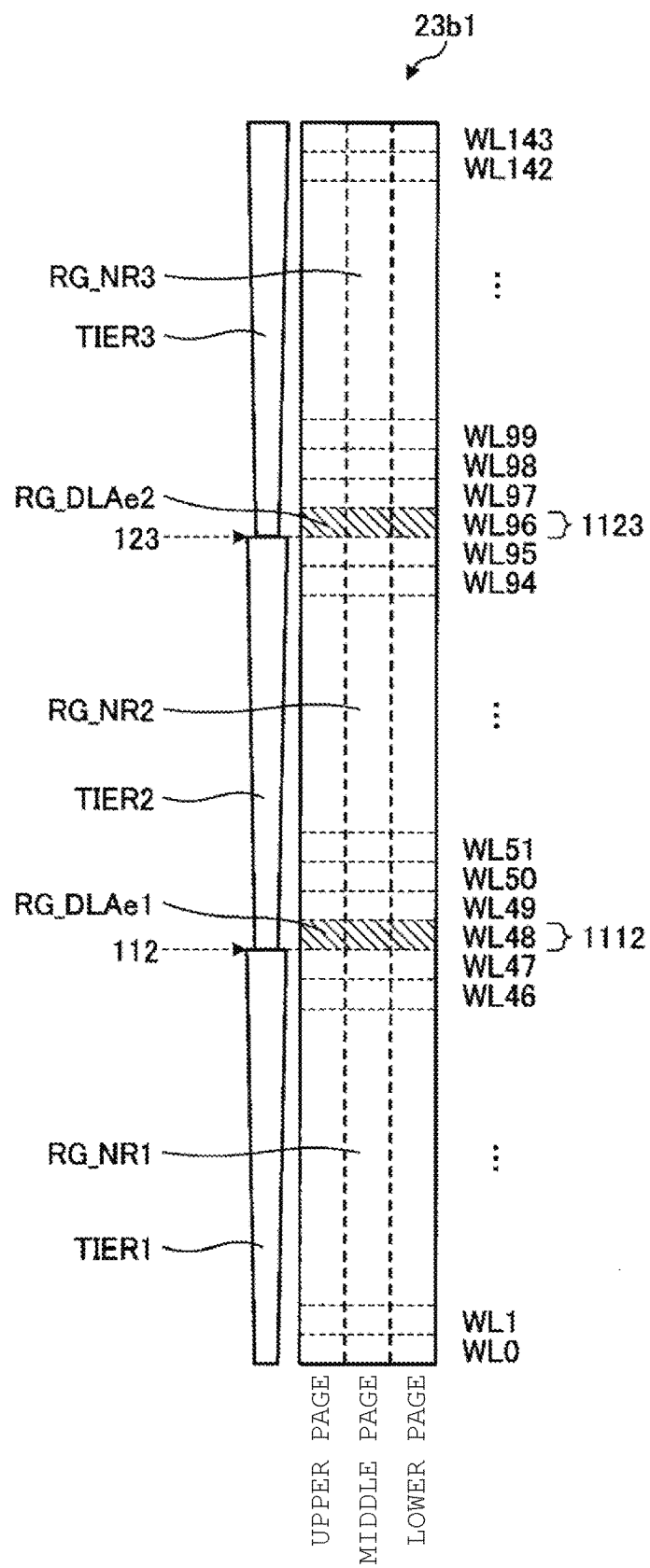
FIG. 15 is a conceptual diagram illustrating the control information used in the sixth modification example of the embodiment.

With this, in the control information 23*b*1 illustrated in FIG. 15, an application target area RG_DLAe1 indicates a range of the physical location of the memory cells MT48 connected to the word line WL48 in the boundary area 1112. An application target area RG_DLAe2 indicates a range of the physical location of the memory cells MT96 connected to the word line WL96 in the boundary area 1123. When a memory cell to be read is in the application target area RG_DLAe1 or the application target area RG_DLAe2, the memory controller 10 may apply the adjacent-word-line compensation read mode by referring to the control information 23*b*1 illustrated in FIG. 15.

As described above, since the adjacent-word-line compensation read mode is applied to the memory cells MT48 and MT96 in the vicinity of the tier boundaries 112 and 123 in a limited manner, even when there are a plurality of tier boundaries, it is possible to improve the reliability of the read operation in the nonvolatile memory 20 and to prevent the reduction of performance.

Figure 16:
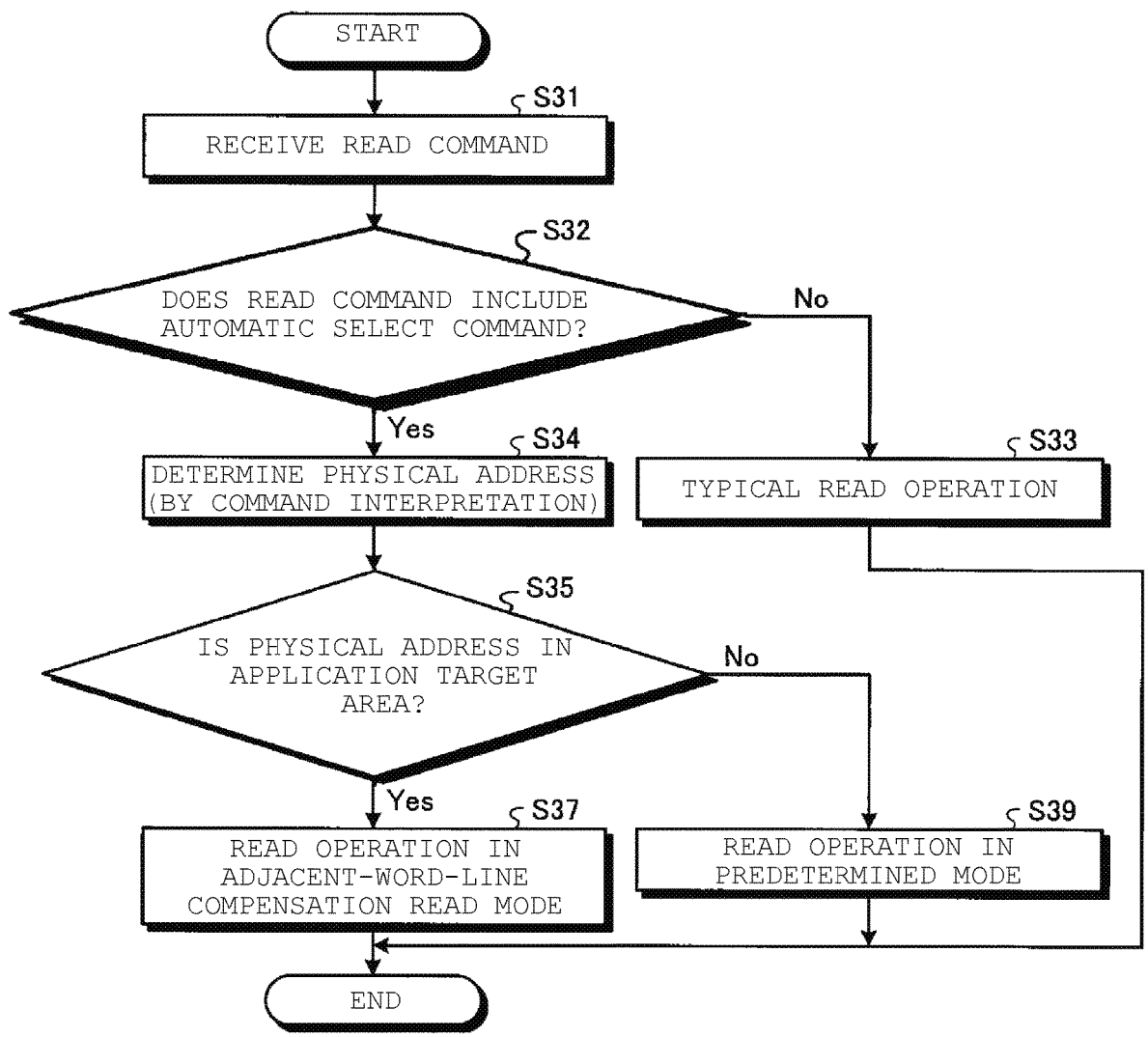
FIG. 16 is a flowchart illustrating an operation of a nonvolatile memory in a seventh modification example of the embodiment.

The process of applying the adjacent-word-line compensation read mode to the memory cell MT48 in the vicinity of the tier boundary 112 in a limited manner may be performed by the command processing unit 21 of the nonvolatile memory 20 as illustrated in FIG. 16. FIG. 16 is a flowchart illustrating an operation of the nonvolatile memory 20 in a seventh modification example of the embodiment. That is, when a read command is received from the memory controller 10 (S31), the nonvolatile memory 20 hands over the read command to the command processing unit (see FIG. 3). The command processing unit 21 analyzes the read command and determines whether the read command includes an automatic select command of a read mode (S32).

Figure 17:
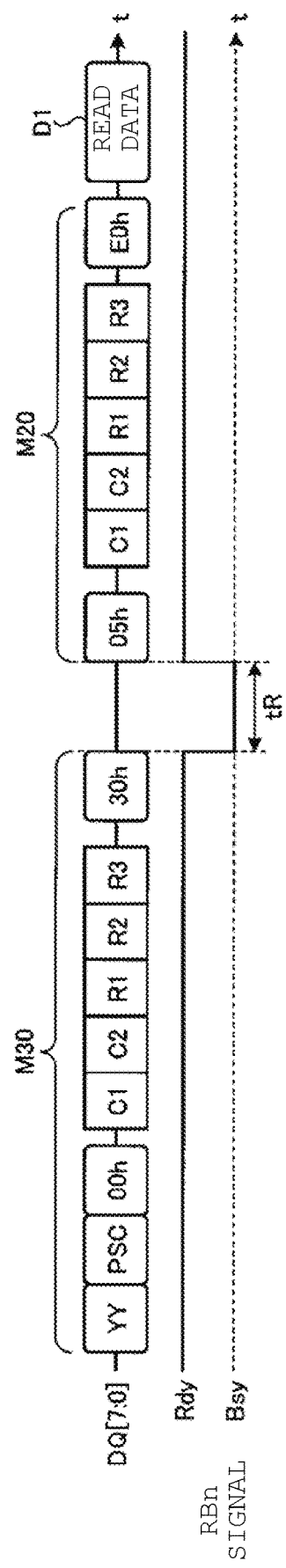
FIG. 17 is a diagram illustrating a command sequence of a read command in the seventh modification example of the embodiment.

The read command received in S31 may include a sense command M30 and a transmission command M20 as illustrated in FIG. 17. FIG. 17 is a diagram illustrating a command sequence of the read command in the seventh modification example of the embodiment. As illustrated in FIG. 17, when a prefix for specifying a read operation to be performed is set to "YY" in the sense command M30, the command processing unit 21 determines that the sense command M30 includes the automatic select command of the read mode. Although not illustrated in the drawing, when the prefix for specifying the read operation to be performed is set to another value or the prefix itself does not exist in the sense command M30, the command processing unit 21 determines that the sense command M30 does not include the automatic select command of the read mode.

In FIG. 17, "PSC" indicates a page select command, "00h" indicates a sensing operation instruction, "C1" and "C2" indicate column addresses, "R1", "R2", and "R3" indicate row addresses, and "30h" indicates a sense start instruction.

Return back to FIG. 16. When the read command does not include the automatic select command of the read mode ("No" in S32), the command processing unit 21 performs a typical read operation (S33) and ends the procedure.

When the read command includes the automatic select command of the read mode ("Yes" in S32), the command processing unit 21 analyzes the read command and determines physical addresses included in the read command (for example, the row addresses "R1", "R2", and "R3" illustrated in FIG. 17) by command interpretation (S34). Furthermore, the command processing unit 21 refers to the control information 23b1 and determines whether the physical addresses in the read command are included in the application target area (S35).

The control information 23b1 may be set in the command processing unit 21 prior to S35, or may be read from the management information storage area 23b when S35 is performed.

When the physical addresses in the read command are included in the application target area ("Yes" in S35), the command processing unit 21 controls the driving unit 22 and the column module 24 to perform a read operation in the adjacent-word-line compensation read mode, and transmits the read data to the memory controller 10 (S37). For example, when a read target is the memory cell MT48 connected to the word line WL48, the nonvolatile memory 20 reads data from the adjacent memory cell MT49 connected to the adjacent word line WL49, and sequentially read data as a selection candidate from the target memory cell MT48 connected to the target word line WL48 at a plurality of read voltages. Then, on the basis of the data read from the adjacent memory cell MT49, the nonvolatile memory 20 selects one read data of the plurality of pieces of candidate read data of the target memory cell MT48 for each memory pillar (that is, each bit line). With this, the nonvolatile memory 20 selects one read data, in which an influence from the memory cell connected to the adjacent word line is compensated, from the plurality of pieces of candidate read data, and transmits the selected read data to the memory controller 10. Therefore, it is possible to improve the reliability of the read operation on the memory cell in the vicinity of the tier boundary.

In contrast, when the physical addresses in the read command are not included in the application target area ("No" in S35), the command processing unit 21 performs a read operation in the typical read mode without selecting the adjacent-word-line compensation read mode, and transmits the read data to the memory controller 10 (S39). For example, the command processing unit 21 controls the driving unit 22 and the column module 24 to perform a read operation in the typical read mode (the fast read mode, the normal read mode, and the like), and transmits the read data to the memory controller 10. With this, it is possible to prevent the unnecessary reduction of performance (for example, an increase in the period tR).

In FIG. 17, the period tR indicates a time until the read operation (S37 or S39) is completed after the nonvolatile memory 20 receives the read command (S31) and a transmission operation corresponding to a transmission command can be started. The transmission command M20 instructs the read data to be transmitted to the memory controller 10 after the read operation is completed. In the transmission command M20, "05h" indicates a transmission instruction, "C1" and "C2" indicate column addresses, "R1", "R2", and "R3" indicate row addresses, and "E0h" indicates an output start instruction. The period tR, which indicates the time until the read operation is completed after the nonvolatile memory 20 receives the read command, tends to become longer for the normal read mode relative to the fast read mode, and the adjacent-word-line compensation read mode relative to the normal read mode (see FIGS. 2A to 2C).

As described above, in the nonvolatile memory 20, the adjacent-word-line compensation read mode is applied to the memory cell MT48 in the vicinity of the tier boundary 112 in a limited manner, so that it is also possible to improve the reliability of the read operation in the nonvolatile memory 20 and to prevent the reduction of performance.

In addition, it is also possible to change a write operation on the memory cell in the vicinity of the tier boundary in a limited manner. Program parameters on the memory cell include an initial VPGM and a delta VPGM. A program operation for the memory cell is performed by repeating at least one program loop, which includes a program voltage application operation of applying a program voltage VPGM to increase a threshold voltage of the memory cell and a verification operation of confirming whether the threshold voltage of the memory cell reaches a target threshold voltage corresponding to write data. In one or more loops, the program voltage used for a first loop in the program operation is referred to as the initial VPGM. Between a plurality of loops, the program voltage is increased higher than the program voltage used in the first loop. The increase in the program voltage is referred to as the delta VPGM.

The nonvolatile memory 20 may decrease one or both of the initial VPGM and the delta VPGM with respect to the memory cell in the vicinity of the tier boundary, thereby performing a write operation with less wear while sacrificing write performance. Furthermore, the nonvolatile memory 20 may perform a write operation on a memory cell not in the vicinity of the tier boundary by QLC/TLC/MLC mode, and perform a write operation on the memory cell in the vicinity of the tier boundary by TLC/MLC/SLC mode (to store less bits per cell). The nonvolatile memory 20 may also perform the same control for the read operation.

Alternatively, the memory controller 10 may control the nonvolatile memory 20 such that one or both of the initial VPGM and the delta VPGM is decreased for the memory cell in the vicinity of the tier boundary, thereby performing a write operation with less wear while sacrificing write performance. Specifically, when the write operation is performed on the memory cell in the vicinity of the tier boundary, a parameter value may be specified to decrease one or both of the initial VPGM and the delta VPGM, and otherwise, a default parameter value of the initial VPGM or the delta VPGM is specified. Furthermore, the memory controller 10 issues a command to the nonvolatile memory 20, in which the command instructs that a write operation be performed on a memory cell not in the vicinity of the tier boundary by QLC/TLC/MLC and a write operation is performed on the memory cell in the vicinity of the tier boundary by TLC/MLC/SLC mode (to store less bits per cell). The memory controller 10 may also perform the same control for the read operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of memory cells at intersection locations of a plurality of stacked word lines and a memory pillar passing through the plurality of word lines in a stacking direction, the plurality of word lines including a first group of word lines stacked above a second group of word lines in the stacking direction; and
a controller configured to read data of a first memory cell in a first read mode and to read data of a second memory cell in a second read mode different from the first read mode, wherein
the first memory cell is at an intersection location of a word line that is in a boundary area of the first and second groups of word lines and the memory pillar, and the second memory cell is at an intersection location of a word line that is not located in the boundary area, wherein
the boundary area that includes the word line is adjacent to a location of the memory pillar where a width of the memory pillar in a direction perpendicular to the stacking direction of the memory pillar discontinuously changes along the stacking direction.

2. The memory system according to claim 1, wherein the first read mode is a read mode that compensates for an influence from a memory cell that is adjacent to the first memory cell along the memory pillar.

3. The memory system according to claim 2, wherein the second read mode is one of a normal read mode and a fast read mode.

4. The memory system according to claim 1, wherein the controller is configured to perform a retry sequence when error correction of data read from the first memory cell fails, and to read the data of the first memory cell in the first read mode in a first read operation of the retry sequence.

5. The memory system according to claim 1, wherein the controller is configured to read the data of the first memory cell in the second read mode in a first read operation, and to read the data of the first memory cell in the first read mode in a retry read operation that is performed when error correction of the data read in the first read operation fails.

6. The memory system according to claim 5, wherein the controller is further configured to retrieve information on reliability of data stored in the first memory cell, and when the information on reliability of data stored in the first memory cell indicates a first reliability level, the controller reads the data of the first memory cell in the second read mode in a retry read operation, and when information on reliability of the data stored in the first memory cell indicates a second reliability level lower than the first reliability level, the controller reads the data of the first memory cell in the first read mode in the retry read operation.

7. The memory system according to claim 6, wherein the information on reliability of the data stored in the first memory cell includes at least one of a bit error ratio detected in the error correction of the data read from the first memory cell, a retry rate of a read operation performed on the first memory cell, and a number of read operations performed on a block of memory cells including the first memory cell since the first memory cell has been programmed.

8. The memory system according to claim 1, wherein the controller is further configured to retrieve information on reliability of data stored in the first memory cell, and,
when the information on reliability of data stored in the first memory cell indicates a first reliability level, the controller reads the data of the first memory cell in the second read mode in a first read operation, and when the information on reliability of the data stored in the first memory cell indicates a second reliability level lower than the first reliability level, the controller reads the data of the first memory cell in the first read mode in the first read operation.

9. The memory system according to claim 1, wherein the first memory cell is configured to store a plurality of bits including a first bit and a second bit, and
the controller is configured to read data of the first bit in the first memory cell in the first read mode, and read data of the second bit in the first memory cell in the second read mode.

10. The memory system according to claim 1, wherein the boundary area includes one word line.

11. The memory system according to claim 1, wherein the boundary area includes two or more word lines.

12. The memory system according to claim 1, wherein the boundary area includes a word line adjacent to a boundary of a first tier of the memory pillar and a second tier of the memory pillar on top of which the first tier of the memory pillar is stacked.

13. The memory system according to claim 12, wherein the boundary area further includes an area including a word line corresponding to a lower end of the second tier.

14. The memory system according to claim 12, wherein the boundary area further includes an area including a word line corresponding to an upper end of the first tier.

15. The memory system according to claim 1, wherein the first memory cell is located at an intersection location of a first word line and the memory pillar, and the second memory cell is located at an intersection location of a second word line and the memory pillar, and
the first and second word lines are separated by at least two word lines.

16. A nonvolatile memory device comprising:
a memory cell array including a plurality of memory cells at intersection locations of a plurality of stacked word lines and a memory pillar passing through the plurality of word lines in a stacking direction, the plurality of word lines including a first group of word lines stacked above a second group of word lines in the stacking direction; and
a control circuit configured to read data of a first memory cell in a first read mode and to read data of a second memory cell in a second read mode different from the first read mode in response to a command sequence including a sense command and an automatic read mode selection command, wherein
the first memory cell is at an intersection location of a word line that is in a boundary area of the first and second groups of word lines and the memory pillar, and the second memory cell is at an intersection location of a word line that is not located in the boundary area, wherein the boundary area that includes the word line is adjacent to a location of the memory pillar where a width of the memory pillar in a direction perpendicular to the stacking direction of the memory pillar discontinuously changes along the stacking direction.

17. The nonvolatile memory device according to claim 16, wherein
the first memory cell is located at an intersection location of a first word line and the memory pillar, and the second memory cell is located at an intersection location of a second word line and the memory pillar, and
the first and second word lines are separated by at least two word lines.

18. A method of performing a read operation on a nonvolatile memory including a memory cell array the memory cell array, including a plurality of memory cells at intersection locations of a plurality of stacked word lines and a memory pillar passing through the plurality of word lines in a stacking direction, the plurality of word lines including a first group of word lines stacked above a second group of word lines in the stacking direction, said method comprising:
reading data of a first memory cell in a first read mode and reading data of a second memory cell in a second read mode different from the first read mode by sending a command sequence including a sense command and an automatic read mode selection command to the nonvolatile memory, wherein
the first memory cell is at an intersection location of a word line that is in a boundary area of the first and second groups of word lines and the memory pillar, and the second memory cell is at an intersection location of a word line that is not located in the boundary area, wherein
the boundary area that includes the word line is adjacent to a location of the memory pillar where a width of the memory pillar in a direction perpendicular to the stacking direction of the memory pillar discontinuously changes along the stacking direction.

19. The method according to claim 18, wherein
the first memory cell is located at an intersection location of a first word line and the memory pillar, and the second memory cell is located at an intersection location of a second word line and the memory pillar, and
the first and second word lines are separated by at least two word lines.

* * * * *

UNITED STATES PATENT AND TRADEMARK OFFICE
CERTIFICATE OF CORRECTION

PATENT NO. : 10,910,068 B2  Page 1 of 1
APPLICATION NO. : 16/727488
DATED : February 2, 2021
INVENTOR(S) : Kazutaka Takizawa et al.

It is certified that error appears in the above-identified patent and that said Letters Patent is hereby corrected as shown below:

In the Claims

In Claim 18, Column 1, Line 15, please delete "memory including a memory cell array the memory cell array, including" and replace with --memory including a memory cell array, the memory cell array including--.

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*